United States Patent
Yonemoto et al.

(10) Patent No.: US 9,026,697 B2
(45) Date of Patent: May 5, 2015

(54) DATA PROCESSING APPARATUS

(75) Inventors: Tomonori Yonemoto, Yokohama (JP); Hideru Ikeda, Tokyo (JP); Keisuke Nakazono, Tokyo (JP)

(73) Assignee: Olympus Corporation, Tokyo (JP)

( * ) Notice: Subject to any disclaimer, the term of this patent is extended or adjusted under 35 U.S.C. 154(b) by 153 days.

(21) Appl. No.: 13/367,490

(22) Filed: Feb. 7, 2012

(65) Prior Publication Data

US 2012/0203942 A1    Aug. 9, 2012

(30) Foreign Application Priority Data

Feb. 8, 2011    (JP) .................. 2011-024819

(51) Int. Cl.
- *H03H 17/02* (2006.01)
- *G06F 13/28* (2006.01)
- *G06F 5/16* (2006.01)
- *G06F 5/10* (2006.01)

(52) U.S. Cl.
CPC ............... *H03H 17/02* (2013.01); *G06F 13/28* (2013.01); *G06F 5/16* (2013.01); *G06F 5/10* (2013.01); *H03H 2017/0298* (2013.01)

(58) Field of Classification Search
None
See application file for complete search history.

(56) References Cited

U.S. PATENT DOCUMENTS

| | | | |
|---|---|---|---|
| 5,974,516 A * | 10/1999 | Qureshi | ........................... 710/52 |
| 6,809,834 B1 * | 10/2004 | Sato | ............................. 358/1.16 |
| 7,716,396 B1 * | 5/2010 | Liu et al. | ........................ 710/52 |
| 2007/0041050 A1 * | 2/2007 | Wang | ........................... 358/1.16 |
| 2009/0043927 A1 * | 2/2009 | Inoue et al. | ..................... 710/54 |

FOREIGN PATENT DOCUMENTS

| JP | 8-336114 A | 12/1996 |
|---|---|---|
| JP | 2002-140702 A | 5/2002 |
| JP | 2007-226330 A | 9/2007 |
| JP | 2009-265776 A | 11/2009 |
| JP | 2010-176606 A | 8/2010 |
| JP | 2010-283518 A | 12/2010 |

OTHER PUBLICATIONS

Japanese Office Action dated Sep. 24, 2014, issued in corresponding Japanese Patent Application No. 2011-024819; w/English Translation (3 pages).

* cited by examiner

*Primary Examiner* — Idriss N Alrobaye
*Assistant Examiner* — Dayton Lewis-Taylor
(74) *Attorney, Agent, or Firm* — Westerman, Hattori, Daniels & Adrian, LLP

(57) ABSTRACT

A data processing apparatus may include a data acquisition unit, a buffer unit that includes a plurality of division buffers, a valid data area determination unit that calculates an area of valid data, a buffer state management unit that manages whether or not the data is stored in the division buffer, a data write control unit that writes data of a unit of the storage capacity of the division buffer, which at least includes data indicated to be valid data by the valid data information within the data, to the division buffer in which no data is stored, the division buffer being selected based on the management information, and a data read control unit that reads data indicated to be valid data by the valid data information from the division buffer in which data is stored, the division buffer being selected based on the management information.

5 Claims, 15 Drawing Sheets

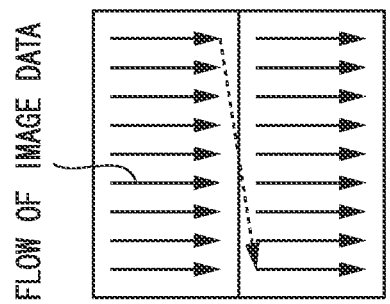
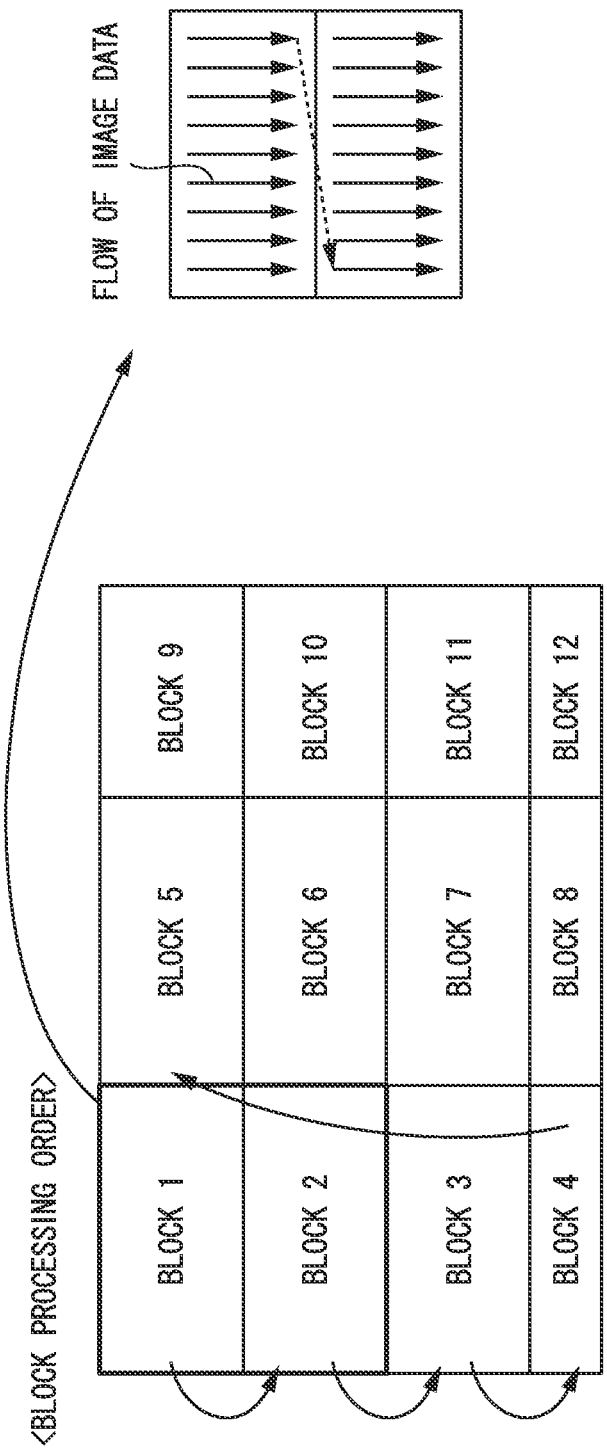

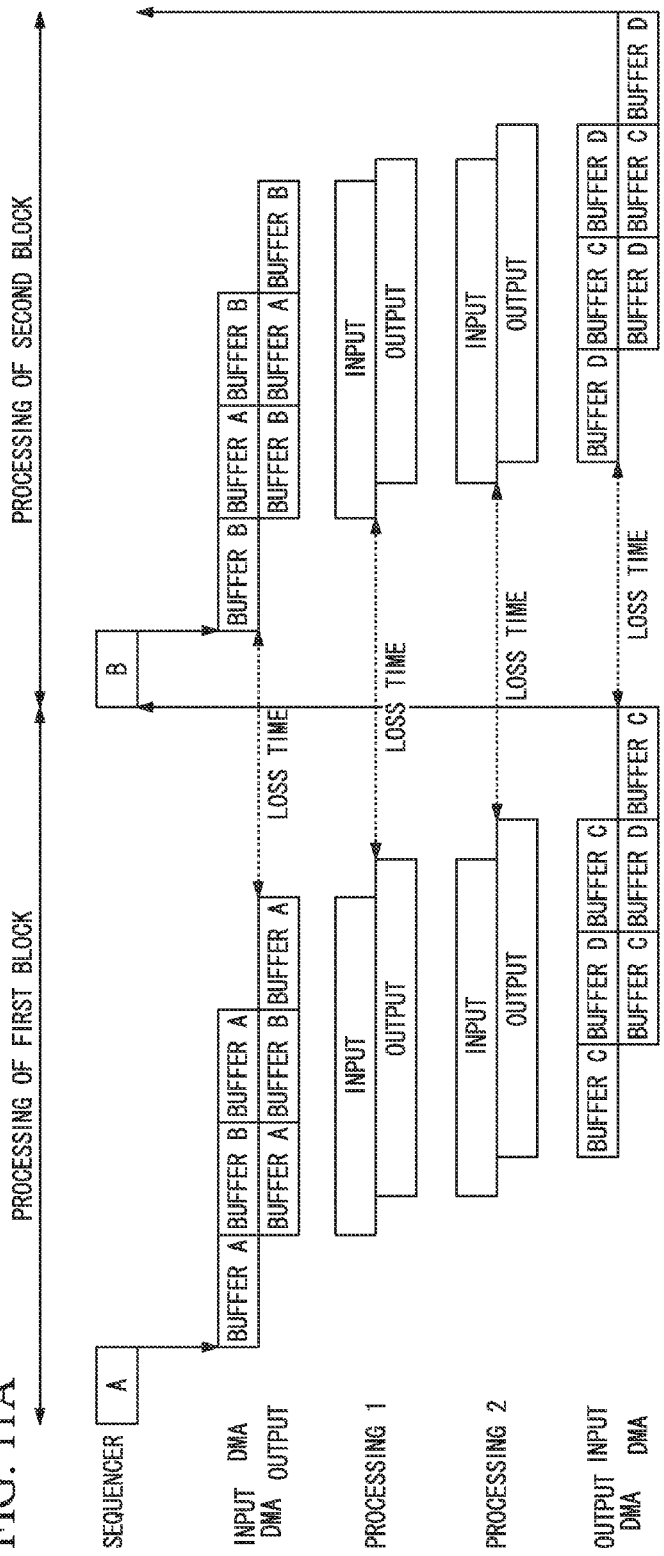

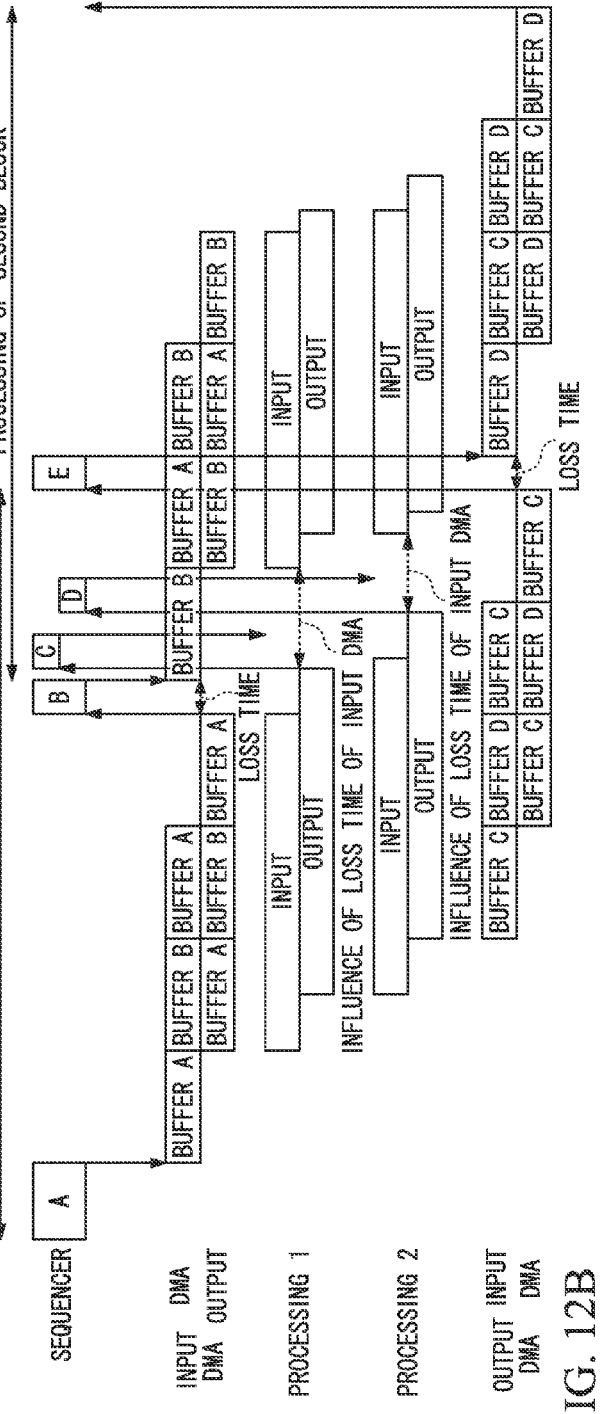

DATA PROCESSING APPARATUS

BACKGROUND OF THE INVENTION

1. Field of the Invention

The present invention relates to a data processing apparatus.

Priority is claimed on Japanese Patent Application No. 2011-024819, filed Feb. 8, 2011, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

In an image processing apparatus included in an image pickup device such as a still-image camera, a moving-image camera, a medical endoscope camera, or an industrial endoscope camera, an image processing circuit, which performs a filtering operation and the like alternately using two line buffers, is disclosed, for example, in Japanese Unexamined Patent Application, First Publication No. H8-336114. In the above-described image processing circuit, a still image of one frame is divided into a plurality of blocks, and image processing is performed to each divided block. FIGS. 10A and 10B are diagrams illustrating a block division method in a pipeline process in accordance with the related art. When a still image of one frame is divided into a plurality of blocks as shown in FIG. 10A, a flow of image data to be processed within each divided block is continuous, but a flow of data between different blocks is not continuous as shown in FIG. 10B.

FIGS. 11A and 11B are diagrams illustrating an example of processing timings of a pipeline process in accordance with the related art. As shown in FIGS. 11A and 11B, there is a need for a procedure for resetting an image processing circuit and resetting a range of image data corresponding to the next block to be processed, or the like every time processing of one block is completed. When an operation of the image processing circuit is controlled for each block processing, a period of time loss in which the image processing circuit does not operate occurs during each block processing as described above. A loss time in which the image processing circuit does not operate affects a total processing time of a pipeline process of processing a still image of one frame.

Technology for reducing time loss in processing between blocks in a pipeline process is disclosed in Japanese Unexamined Patent Application, First Publication No. 2010-176606. FIGS. 12A and 12B are diagrams illustrating an example of processing timings of the pipeline process. In this technology, as shown in FIG. 12A, an interrupt signal (a process completion interrupt signal) indicating that a process by a processing circuit is completed for each processing circuit constituting a pipeline is output to a sequencer, which controls the entire pipeline process. As in FIG. 12B, every time the process completion interrupt signal is input from the processing circuit, the sequencer individually changes settings of the processing circuit. Thereby, the sequencer changes the settings of the processing circuit every time a process of each processing circuit for each block is completed, not every time processing of a divided block is started. In the technology of Japanese Unexamined Patent Application, First Publication No. 2010-176606, the sequencer changes the settings of each processing circuit for every processing circuit as described above, thereby reducing the time loss in processing between blocks and increasing the speed of the pipeline process for a still image of one frame.

Even when settings change after processing of one block is completed and then processing of the next block is started in a state in which the technology disclosed in Japanese Unexamined Patent Application, First Publication No. 2010-176606 is adopted in processing circuits constituting the pipeline, there is still a processing circuit in which time loss occurs among the processing circuits constituting the pipeline. For example, in a data processing apparatus having access to data stored in an external memory such as a dynamic random access memory (DRAM) connected to a common data bus by a burst transfer of direct memory access (DMA), a loss time is caused by a combination of a size (capacity) or configuration of a buffer for temporarily storing data included in the data processing apparatus and an amount of data to be transferred by a DMA transfer (a burst transfer). This is caused by the presence of a break (a burst boundary) in data on an external memory because the burst transfer is performed in units of predetermined burst widths.

Hereinafter, an example of the data processing apparatus in which a loss time occurs will be described. FIG. 13 is a block diagram illustrating an example of a schematic configuration of a data processing apparatus in which the loss time occurs in accordance with the related art. The data processing apparatus of the related art shown in FIG. 13 includes two buffers (buffers A and B), a DMA interface (I/F) for acquiring image data (data for block processing) necessary for block processing (image processing) stored in an external memory via a common data bus and writing (storing) the image data to one buffer, and a buffer read circuit for reading and block processing (image processing) of data for block processing stored in the other buffer, for example, to output the block-processed (image-processed) data to the next image processing unit of the pipeline.

In the data processing apparatus of the related art having the configuration as shown in FIG. 13, buffer operations (writing of data to one buffer and reading of data from the other buffer) are alternately switched using two buffers, so that data input/output are performed at the same time. A size of the buffer storing the data for block processing is the same buffer size (storage capacity) as the amount of data for block processing acquired by the DMA I/F from an external memory in a DMA transfer (a burst transfer). That is, the data processing apparatus of the related art shown in FIG. 13 is managed in units of burst boundaries of data for block processing capable of being stored in one buffer by one DMA transfer (one burst transfer).

FIG. 14A is a diagram illustrating an example when data is stored in the buffer included in the data processing apparatus in accordance with the related art. FIG. 14B is a diagram illustrating an example of processing timings for each block. In the data processing apparatus of the related art shown in FIG. 13, for example, data for block processing necessary to process a first block is stored in the two buffers by the DMA I/F in the order of Buffer A→Buffer B→Buffer A→Buffer B as shown in FIG. 14A. However, data for block processing to be burst-transferred from the external memory is not necessarily consistent with a burst boundary. As shown in FIG. 14A, the data for block processing is stored in the buffer across a burst boundary of data when the DMA I/F performs the burst transfer. Thus, the amount of data for block processing to be used in block processing of blocks may be small, for example, as in data for block processing stored in the buffer B by a fourth DMA transfer (a burst transfer) of processing of a first block or data for block processing stored in the buffer A by first and fifth DMA transfers (burst transfers) of processing of a second block. Data for block processing to be unused in block processing is also DMA-transferred by a burst transfer of the DMA I/F.

In the data processing apparatus of the related art, the buffer read circuit performs block processing by alternately reading data for block processing stored in the two buffers. Here, processing timings of the data processing apparatus of the related art when the data for block processing is stored in each buffer as shown in FIG. 14A will be described using FIG. 14B.

First, the DMA I/F stores data for block processing DMA-transferred (burst-transferred) from the external memory in the buffer A. If storing of the data for block processing to the buffer A is completed, the DMA I/F continuously stores the data for block processing transferred by the DMA transfer from the external memory in the buffer B.

In addition, if the data for block processing is stored in the buffer A by the DMA transfer, the buffer read circuit starts block processing of the first block by reading the data for block processing stored in the buffer A. If data for block processing is stored in the buffer B after the block processing of the first block using the data for block processing stored in the buffer A has ended, the buffer read circuit continues the block processing of the first block by continuously reading the data for block processing stored in the buffer B.

Thereafter, if the block processing of the first block using the data for block processing stored in the buffer A has ended, the DMA I/F continuously DMA-transfers data necessary for the block processing of the first block from the external memory and stores the data for block processing in the buffer A. Thereafter, the DMA I/F sequentially performs a DMA transfer of the data necessary for the block processing of the first block from the external memory and storing of the data in one buffer.

In addition, if the data for block processing is stored in the buffer A after the block processing of the first block using the data for block processing stored in the buffer B has ended, the buffer read circuit continues the block processing of the first block by continuously reading the data for block processing stored in the buffer A. Thereafter, the buffer read circuit sequentially performs the block processing of the first block using the data for block processing stored in the buffer B and the buffer A.

If storing of last data for block processing to be used in block processing of the first block (data for block processing stored in the buffer B by a fourth DMA transfer in FIG. 14A) to one buffer is completed, the DMA I/F can start a DMA transfer of data for block processing to be used in block processing of the second block to be continuously processed next and storing of the data in the other buffer by making settings necessary to process the second block. Because the last data for block processing to be used in the block processing of the first block is stored in the buffer B, data for block processing to be used in the block processing of the second block is sequentially stored from the buffer A. More specifically, as shown in FIG. 14A, data is stored in the two buffers in the order of Buffer A→Buffer B→Buffer A→Buffer B→Buffer A.

In addition, after the block processing of the first block using the data for block processing stored in the buffer A has ended, the buffer read circuit continuously performs the block processing of the first block by reading the last data for block processing stored in the buffer B. The last data for block processing for performing the block processing of the first block is some (a fraction of) data for block processing within the data for block processing stored in the buffer B. Thus, the block processing of the first block using the last data for block processing stored in the buffer B ends at a comparatively early time. Then, the buffer read circuit is in a state in which the block processing of the second block to be processed next can be started.

However, when the state in which the block processing of the second block can be started has been reached, a DMA transfer of initial data necessary for the block processing of the second block from the external memory by the DMA I/F and storing in the buffer A are not completed. This occurs, for example, when a processing time of the last data for block processing of the first block stored in the buffer B is shorter than a DMA transfer time of the initial data for block processing of the second block to the buffer A as shown in FIG. 14B.

Thus, the buffer read circuit waits until the initial data necessary for the block processing of the second block is stored in the buffer A for the block processing of the second block. There is a problem in that a time for which the buffer read circuit waits to start the block processing (or a delay time of a block processing start) until the data necessary for the block processing is stored in the buffer, that is, until the DMA transfer (the burst transfer) is completed, becomes a loss time in the data processing apparatus.

In addition, if the initial data for block processing of the second block is stored in the buffer A, the buffer read circuit starts the block processing of the second block by reading the data for block processing stored in the buffer A. The buffer read circuit is in a state in which the block processing of the second block is continued by continuously reading the data for block processing stored in the buffer B after initial block processing of the second block using the data for block processing stored in the buffer A has ended.

However, when the initial data for block processing of the second block is (a fraction of) data within the data of block processing stored in the buffer A as shown in FIG. 14A, the block processing of the second block using the initial data for block processing stored in the buffer A ends comparatively early. Because a block processing time of the buffer A of the second block is shorter than a DMA transfer time of the buffer B of the second block when a state in which the block processing of the second block is continued by reading the data for block processing stored in the buffer B is reached, a DMA transfer from an external memory of data for block processing necessary for block processing of the second block by the DMA I/F and a storing in the buffer B are not completed.

Thus, the buffer read circuit waits until the data necessary for the block processing of the second block is stored in the buffer B for the block processing of the second block. There is a problem in that a time, for which the buffer read circuit waits to start the block processing until the data necessary for the block processing is stored in the buffer, becomes a waste of time (time loss) in the data processing apparatus. This loss time affects the entire processing time of the pipeline process.

FIG. 15 is a block diagram illustrating another example of a schematic configuration of the data processing apparatus in accordance with the related art. To increase the possibility of reducing the loss time, the number of buffers to be mounted in the data processing apparatus may be increased from 2 to 4 (buffers A, B, C, and D) as shown in FIG. 15. However, a circuit scale of the data processing apparatus is increased if the number of buffers mounted in the data processing apparatus is increased.

SUMMARY

The present invention provides a data processing apparatus capable of reducing a loss time during processing of each block without increasing a storage capacity of a buffer included in the data processing apparatus even when data necessary for processing is arranged across a break in a transfer when the data is transferred in the data processing apparatus that performs processing for each divided block.

A data processing apparatus may include: a data acquisition unit that acquires data in each unit for acquiring data, the unit being predetermined; a buffer unit that includes a plurality of division buffers, each of the plurality of division buffers having a predetermined storage capacity less than an amount to be acquired in one unit for acquiring data by the data acquisition unit, a total storage capacity of the plurality of division buffers being equal to or greater than an amount acquired in two units for acquiring data by the data acquisition unit; a valid data area determination unit that calculates an area of valid data within data acquired by the data acquisition unit, the valid data area determination unit outputting valid data information indicating whether or not the data acquired by the data acquisition unit is valid data; a buffer state management unit that manages whether or not the data is stored in the division buffer for each division buffer included in the buffer unit, the buffer state management unit outputting management information of each managed division buffer; a data write control unit that writes data of a unit of the storage capacity of the division buffer, which at least includes data indicated to be valid data by the valid data information within the data acquired by the data acquisition unit in one data acquisition, to the division buffer in which no data is stored, the division buffer being selected based on the management information; and a data read control unit that reads data indicated to be valid data by the valid data information from the division buffer in which data is stored, the division buffer being selected based on the management information.

The data write control unit may assume that the plurality of division buffers within the buffer unit are connected in a ring shape, and sequentially writes data acquired by the data acquisition unit in one data acquisition to the continuous division buffers sequentially selected based on the management information in units of storage capacity of the division buffers. The data write control unit may output write completion information including information indicating the division buffer to which the data has been written and a notification indicating that writing of the data has been completed every time the writing of the data to the division buffer is completed. The buffer state management unit may change management information of the division buffer to which data of the unit of the storage capacity of the division buffer has been written to a state in which the data is stored based on the write completion information.

The data read control unit may assume that the plurality of division buffers within the buffer unit are connected in the ring shape, and output read completion information including information indicating the division buffer from which the data has been read and a notification indicating that reading of the data has been completed every time the reading of stored data from the division buffers sequentially selected based on the management information is completed. The buffer state management unit may change management information of the division buffer from which the data has been read to a state in which no data is stored based on the read completion information.

The buffer state management unit may change management information of the division buffer in which only unnecessary data is stored to the state in which no data is stored, if the necessary data is included in the data acquired by one data acquisition after writing of data acquired by the data acquisition unit in the one data acquisition to the division buffer has been completed by the data write control unit.

The data write control unit may control only data of the unit of the storage capacity of the division buffer, which at least includes data indicated to be valid data by the valid data information within data acquired by the data acquisition unit in one data acquisition, to be written to any one of the division buffers in which no data is stored, which is indicated by the management information.

The data write control unit may output a data write control signal to any one division buffer in which no data is stored, which is indicated by the management information, among the plurality of division buffers when writing data of the unit of the storage capacity of the division buffer, which at least includes data indicated to be valid data by the valid data information within data acquired by the data acquisition unit in one data acquisition, to any one of the division buffers.

According to the present invention, it is possible to reduce a loss time during processing of each block without increasing a storage capacity of a buffer included in the data processing apparatus even when data necessary for processing is arranged across a break in a transfer when the data is transferred in the data processing apparatus that performs processing for each divided block.

BRIEF DESCRIPTION OF THE DRAWINGS

The above features and advantages of the present invention will be more apparent from the following description of certain preferred embodiments taken in conjunction with the accompanying drawings, in which:

FIGS. 10A and 10B are diagrams illustrating a block division method in a pipeline process in accordance with the related art;

FIGS. 11A and 11B are diagrams illustrating an example of processing timings of a pipeline process in accordance with the related art;

FIGS. 12A and 12B are diagrams illustrating an example of processing timings of the pipeline process in accordance with the related art;

DETAILED DESCRIPTION OF THE PREFERRED EMBODIMENTS

The present invention will be now described herein with reference to illustrative preferred embodiments. Those skilled in the art will recognize that many alternative preferred embodiments can be accomplished using the teaching of the present invention and that the present invention is not limited to the preferred embodiments illustrated for explanatory purpose.

Figure 1:
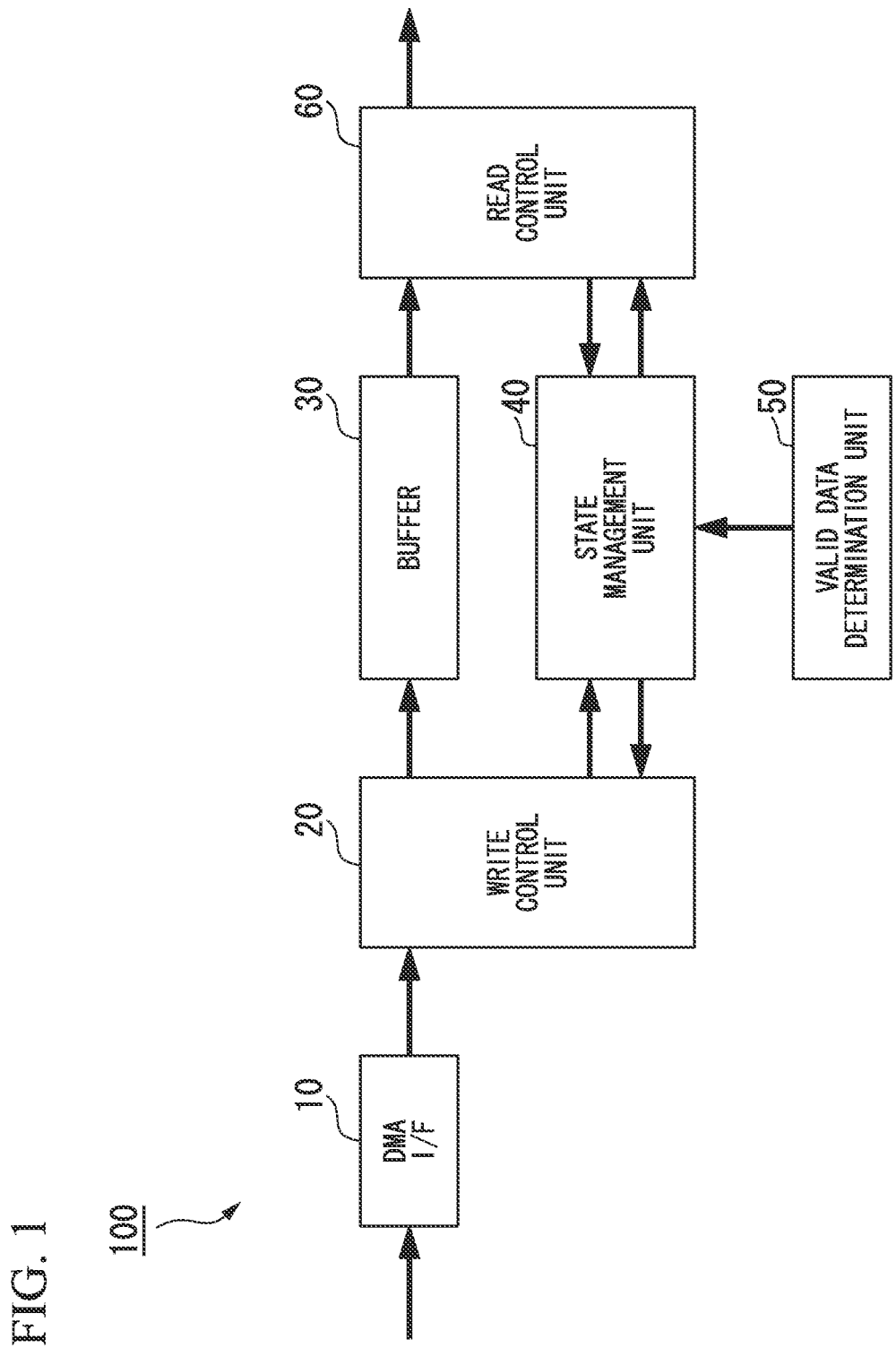
FIG. 1 is a block diagram illustrating a schematic configuration of a data processing apparatus in accordance with the first preferred embodiment of the present invention.

Hereinafter, a first preferred embodiment of the present invention will be described with reference to the drawings. FIG. 1 is a block diagram illustrating a schematic configuration of a data processing apparatus in accordance with the first preferred embodiment of the present invention. The data processing apparatus 100 shown in FIG. 1 includes a DMA I/F 10, a write control unit 20, a buffer 30, a state management unit 40, a valid data determination unit 50, and a read control unit 60. Like the data processing apparatus of the related art, the data processing apparatus 100 divides a still image of one frame into a plurality of blocks and performs block processing (image processing) for each divided block, for example, as shown in FIG. 10A.

More specifically, image data necessary for block processing (data for block processing) stored in an external memory such as DRAM connected to a common data bus is acquired by the DMA I/F 10 in a DMA transfer (a burst transfer). The write control unit 20 writes (stores) the data for block processing acquired by the DMA I/F 10 to the buffer 30 in response to control by the state management unit 40. In addition, the read control unit 60 reads the data for block processing stored in the buffer 30 in response to control by the state management unit 40, and outputs the data to the next image processing unit of a pipeline, for example, after the block processing.

In the data processing apparatus 100 compared to the data processing apparatus of the related art, buffers for storing data for block processing are integrated into one buffer 30, and the state management unit 40 and the valid data determination unit 50 are added to the data processing apparatus 100. To clarify a relationship with the added state management unit 40 in the data processing apparatus 100 shown in FIG. 1, a component corresponding to the DMA I/F included in the data processing apparatus of the related art, which is divided into the DMA I/F 10 and the write control unit 20, is shown. The write control unit 20 and the read control unit 60 corresponding to the buffer read circuit included in the data processing apparatus of the related art control writing of data for block processing to the buffer 30 according to information input from the state management unit 40 and reading of data for block processing from the buffer 30.

The buffer 30 is a storage unit, which temporarily stores data for block processing, for example, constituted by a static random access memory (SRAM) or the like. The buffer 30 has a storage capacity of which a size (a buffer size) is twice an amount of data for block processing to be acquired by the DMA I/F 10 from the external memory in one DMA transfer. That is, although the buffer 30 has a different configuration from the buffer mounted in the data processing apparatus of the related art shown in FIG. 13, the buffer 30 has the storage capacity in which data for block processing acquired by two DMA transfers can be stored as in the data processing apparatus of the related art shown in FIG. 13. In addition, the buffer 30 is divided into a plurality of areas for each predetermined storage capacity, and writing and reading of data for block processing is controlled for each division storage area (hereinafter referred to as a "division buffer"). In addition, the buffer 30 is configured in the form of a ring buffer in which a plurality of division buffers are virtually connected in a ring shape, and writing and reading of data for block processing are controlled.

The DMA I/F 10 acquires data for block processing stored in the external memory via the common data bus in a DMA transfer (a burst transfer). The DMA I/F 10 outputs the acquired data for block processing to the write control unit 20.

The write control unit 20 writes (stores) the data for block processing input from the DMA I/F 10 to the buffer 30. More specifically, when the write control unit 20 stores data for block processing in the buffer 30, a division buffer within the buffer 30 to which the data for block processing is written is first determined based on empty buffer information input from the state management unit 40. Data for block processing is written to a corresponding division buffer within the buffer 30 by a write signal generated based on the determined division buffer. In addition, when writing of data for block processing to a division buffer has been completed, the write control unit 20 outputs a notification indicating that storing of the data for block processing has been completed and information of the division buffer storing the data for block processing to the state management unit 40 as write completion information. An operation of writing (storing) data for block processing to the buffer 30 by the write control unit 20 based on the empty buffer information of the buffer 30 input from the state management unit 40 will be described later in detail.

The read control unit 60 reads the data for block processing stored in the buffer 30, and performs the block processing of the read data for each divided block. More specifically, when the read control unit 60 reads the data for block processing from the buffer 30, a division buffer within the buffer 30 from which the data for block processing is read is first determined based on information (hereinafter referred to as "valid buffer information") regarding the buffer in which valid data to be used in block processing input from the state management unit 40 is stored. According to a read control signal generated based on the determined division buffer, data for block processing is read from a corresponding division buffer within the buffer 30. The read control unit 60 outputs data for block processing after the block processing outside the data processing apparatus 100, for example, such as the next image processing unit of the pipeline. In addition, when reading of data for block processing from a division buffer has been completed, the read control unit 60 outputs a notification indicating that the reading of the data for block processing has been completed and information of the division buffer from which the data for block processing has been read to the state management unit 40 as read completion information. An operation in which the read control unit 60 reads data for block processing from the buffer 30 based on the valid buffer information of the buffer 30 input from the state management unit 40 will be described later in detail.

The valid data determination unit 50 determines whether data for block processing acquired by the DMA I/F 10 in a DMA transfer (a burst transfer) is valid data to be used in block processing or invalid data to be unused in block processing. Information indicating an area of valid data to be used in block processing is output to the state management unit 40 as valid data area information.

The state management unit 40 manages a state of whether or not data for block processing is stored in each division buffer within the buffer 30 based on the write completion information input from the write control unit 20 and the read completion information input from the read control unit 60. More specifically, a division buffer in which data for block processing has been stored by the write control unit 20 is in an in-use state (in which data for block processing is stored), and a division buffer from which data for block processing has been read by the read control unit 60 is in an empty state (in which no data for block processing is stored). In addition, the state management unit 40 changes a division buffer in which invalid data for block processing to be unused in the block processing is stored among division buffers in use to the empty state based on the valid data area information input from the valid data determination unit 50.

The state management unit 40 outputs information of a division buffer in the empty state to the write control unit 20 as the empty buffer information. The empty buffer information is used to determine whether or not a division buffer to which data for block processing is intended to be written is in the empty state when the write control unit 20 writes the data for block processing to the buffer 30. If the division buffer to which the data for block processing is intended to be written is in the empty state, the write control unit 20 determines the division buffer as a division buffer in which the data for block processing can be stored, and determines the division buffer as a division buffer to which the data for block processing is written.

In addition, the state management unit 40 adds valid data information for determining valid data for block processing to be stored in the buffer 30 within data for block processing DMA-transferred (burst-transferred) by the DMA I/F 10 to the empty buffer information based on the valid data area information input from the valid data determination unit 50, and outputs it to the write control unit 20. The valid data information indicates whether the data for block processing acquired by the DMA I/F 10 in the burst transfer is valid data to be used in current block processing or invalid data to be unused in block processing for all data for block processing. The write control unit 20 stores the valid data to be used in the current block processing within the data for block processing input from the DMA I/F 10 in a division buffer in the empty state.

In addition, the state management unit 40 outputs information of a division buffer in the in-use state to the read control unit 60 as the valid buffer information. When the read control unit 60 reads data for block processing from the buffer 30, the valid buffer information is used to determine whether or not valid data for block processing is stored in a division buffer from which the data for block processing is intended to be read. If the valid data for block processing is stored in the division buffer from which the data for block processing is intended to be read, the read control unit 60 determines the division buffer as that from which the data for block processing is readable, and determines the division buffer as that from which the data for block processing is read.

Figure 2:
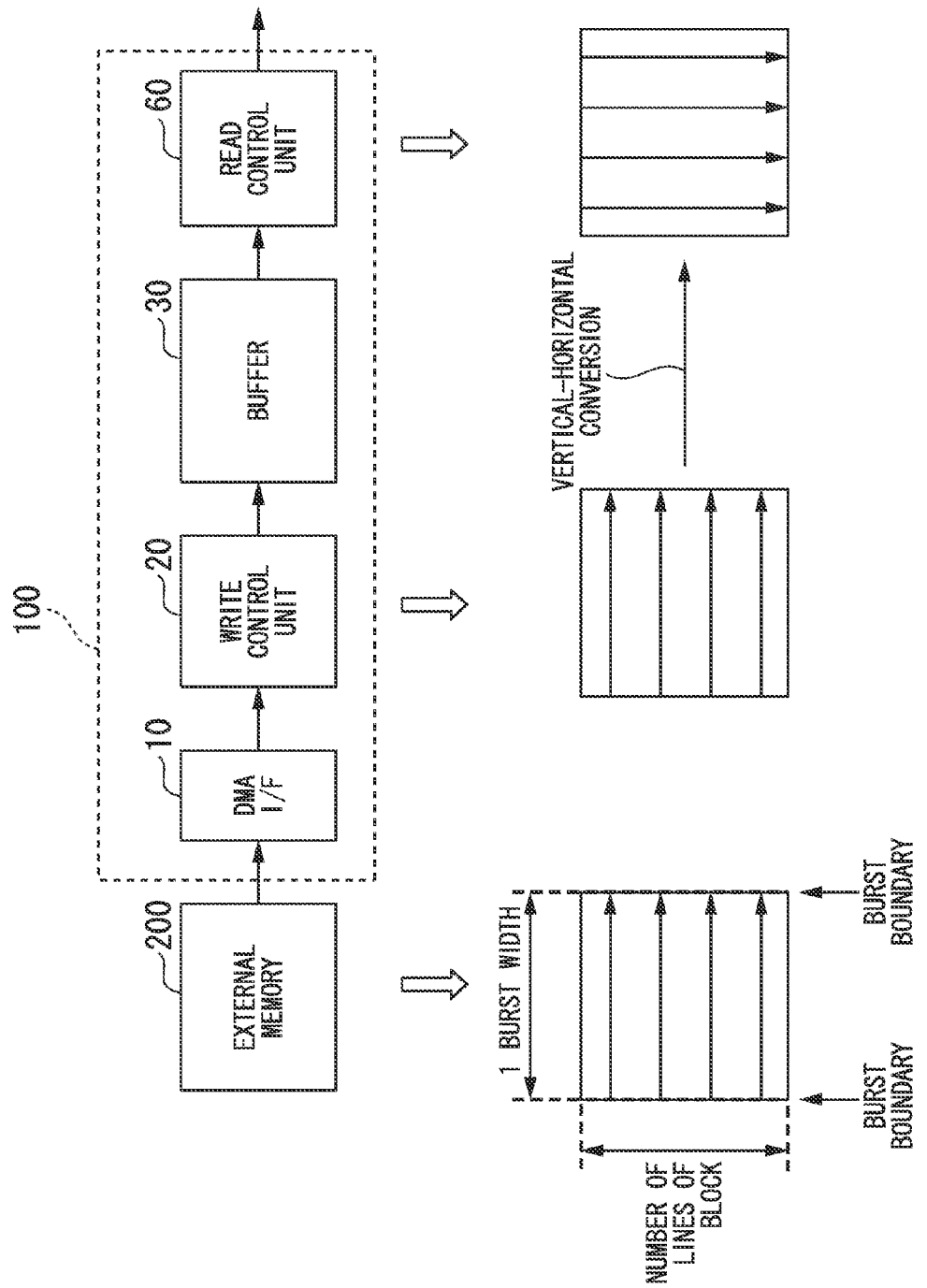
FIG. 2 is a diagram illustrating a flow of processing in the data processing apparatus in accordance with the first preferred embodiment of the present invention.

Here, a flow of block processing in the data processing apparatus 100 in accordance with the first preferred embodiment will be described. FIG. 2 is a diagram illustrating the flow of block processing in the data processing apparatus 100 in accordance with the first preferred embodiment of the present invention. A flow of processing until the data processing apparatus 100 acquires data from the external memory 200 and outputs block-processed data and a flow of data to be read or written in each step are schematically shown in FIG. 2.

Data for block processing in which a flow of data is continuous in a horizontal direction is stored in the external memory 200. In one burst transfer, the DMA I/F 10 acquires data for block processing of one burst width from the external memory 200. The DMA I/F 10 ends the DMA transfer by performing burst transfers of which the number is the same as the number of lines of the data for block processing acquired from the external memory 200. Accordingly, the DMA I/F 10 acquires data for block processing of (One Burst Width× Number of Lines) from the external memory 200 in one DMA transfer. The one burst width acquired by the DMA I/F 10 in one burst transfer becomes a boundary line of a burst boundary.

The write control unit 20 stores the data for block processing acquired by the DMA I/F 10 in the buffer 30 in the same type as a type of storage in the external memory 200. Thereafter, the read control unit 60 performs a vertical-horizontal conversion of the data for block processing stored in the buffer 30, that is, converts and reads the data so that a flow of data is continuous in a vertical direction, performs block processing of the read data, and outputs the block-processed data. The vertical-horizontal conversion of data for block processing by the read control unit 60 may not be an indispensible process according to the flow of the data for block processing.

Figure 3:
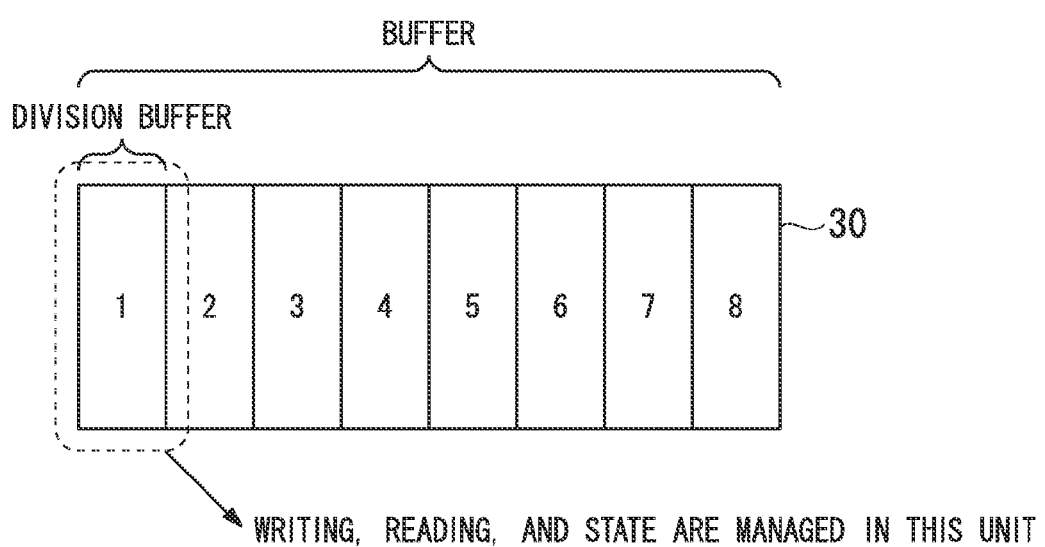
FIG. 3 is a diagram illustrating a configuration example of a buffer included in the data processing apparatus in accordance with the first preferred embodiment of the present invention.

Next, a configuration of the buffer 30 included in the data processing apparatus 100 in accordance with the first preferred embodiment will be described. FIG. 3 is a diagram illustrating a configuration example of the buffer 30 included in the data processing apparatus 100 in accordance with the first preferred embodiment of the present invention. In the configuration example of the buffer 30 shown in FIG. 3, an example in which a total storage capacity of the buffer 30 is divided into 8 division buffers of storage areas 1 to 8 is shown. For the buffer 30, writing of data for block processing by the write control unit 20, reading of data for block processing by the read control unit 60, and state management by the state management unit 40 are performed in units of division buffers. In the following description, reference numerals are assigned to the division buffers so as to distinguish the 8 division buffers (storage areas) as division buffers 1 to 8. A total storage capacity of the division buffers 1 to 8 is the same as the total storage capacity of the buffers A and B of the configuration of the related art shown in FIG. 13.

As described above, the storage capacity of the buffer 30 is a buffer size of twice an amount of data for block processing acquired by the DMA I/F 10 from the external memory 200 in one DMA transfer. The division buffers 1 to 8 are configured in the form of ring buffers virtually connected in the ring shape, and writing and reading of data for block processing are controlled. Accordingly, data for block processing to be stored in four division buffers is acquired by one DMA transfer of the DMA I/F 10.

As shown in FIG. 2, the write control unit 20 stores the data for block processing in which a data flow is continuous in the horizontal direction in the four continuous division buffers. Accordingly, the write control unit 20 stores data for block processing acquired by an initial line burst transfer in storage areas corresponding to first lines of the four division buffers, for example, in the order of Division Buffer 1→Division Buffer 2→Division Buffer 3→Division Buffer 4. Subsequently, the write control unit 20 stores data for block processing acquired by a next-line burst transfer in storage areas corresponding to second lines of the four division buffers again in the order of Division Buffer 1→Division Buffer 2→Division Buffer 3→Division Buffer 4. As described above, the write control unit 20 sequentially stores data for block processing of (One Burst Width×Number of Lines) acquired by the DMA I/F 10 in a DMA transfer in the four division buffers.

In addition, as shown in FIG. 2, the read control unit 60 performs the vertical-horizontal conversion of data for block processing stored in the buffer 30, and reads the converted data so that a data flow is continuous in the vertical direction. Accordingly, the read control unit 60 reads data for block processing of one first vertical line initially stored in the division buffer 1, and subsequently reads data for block processing of one second vertical line stored in the division buffer 1. After reading of all data for block processing stored in the division buffer 1 has been completed by reading one last vertical line stored in the division buffer 1, data for block processing of one first vertical line stored in the division buffer 2 is continuously read. As described above, the read control unit 60 reads data for block processing for each division buffer, and ends reading of the data for block processing when reading of all data for block processing stored in the four division buffers has been completed.

Figure 4:
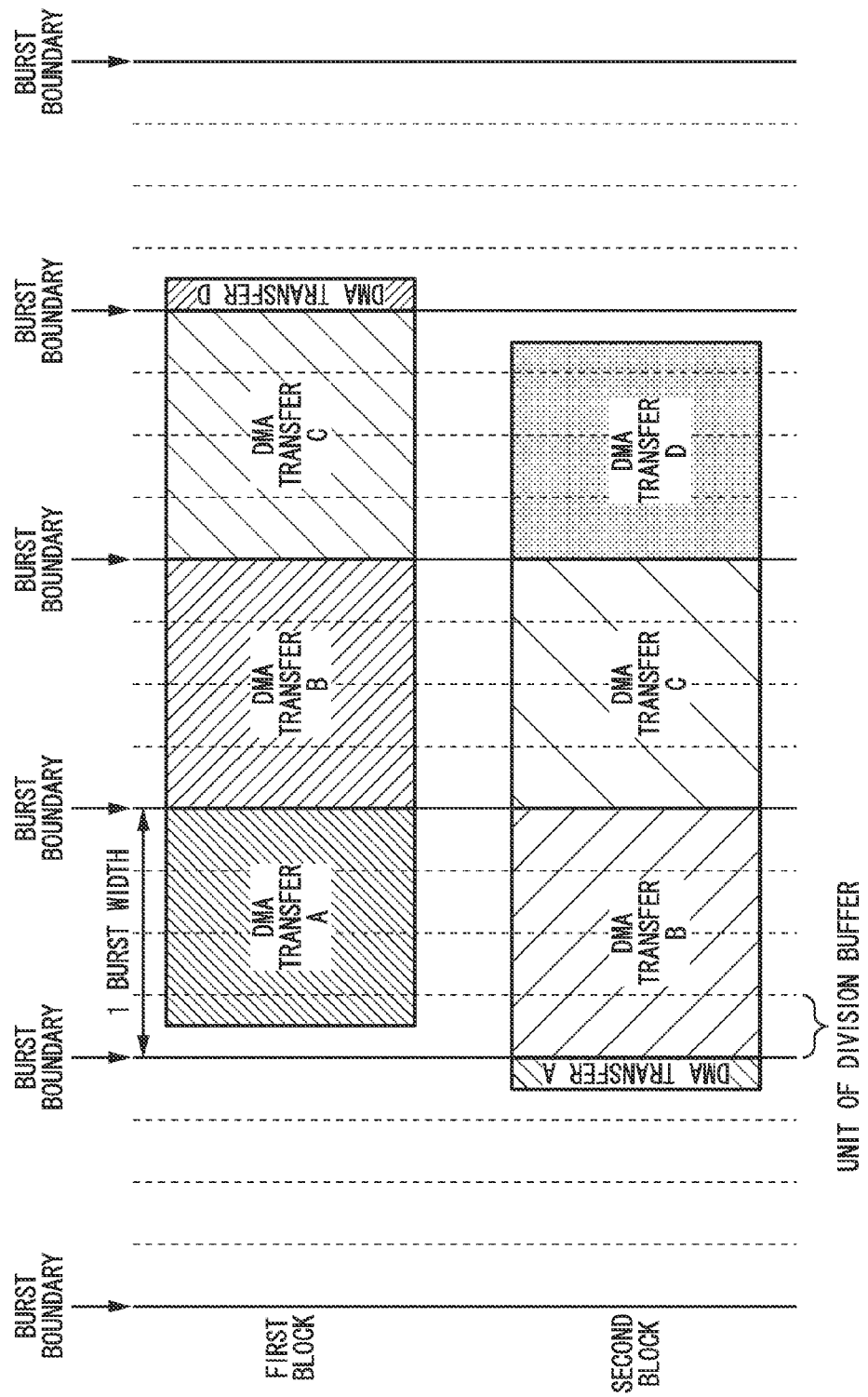
FIG. 4 is a diagram illustrating an example when data has been stored in the buffer included in the data processing apparatus in accordance with the first preferred embodiment of the present invention.

Next, an example in which the state management unit 40 and the valid data determination unit 50 included in the data processing apparatus 100 in accordance with the first preferred embodiment output information to the write control unit 20 and the read control unit 60 will be described. FIG. 4 is a diagram illustrating an example when data for block processing has been stored in the buffer 30 included in the data processing apparatus 100 in accordance with the first preferred embodiment of the present invention. As the example of storage of data for block processing shown in FIG. 4, an amount of data for block processing corresponding to one block corresponds to three DMA transfers when block processing (image processing) is performed for each of a plurality of blocks into which a still image of one frame is divided as shown in FIG. 10A and data necessary for the block processing is arranged across a burst boundary when the DMA I/F 10 performs a burst transfer.

The DMA transfer by the DMA I/F 10 is a data transfer in units of burst widths. This does not mean that only valid data for block processing included in one burst width is DMA-transferred. Although it is possible to acquire all data for block processing corresponding to one block by three DMA transfers when data for block processing is not arranged across the burst boundary, all data for block processing is acquired by four DMA transfers when data for block processing is arranged across the burst boundary as in the example of storage of data for block processing shown in FIG. 4. Thus, there is a possibility of invalid data for block processing being included during a first DMA transfer and a last DMA transfer. In the example of storage of data for block processing shown in FIG. 4, a fraction of data for block processing, which is less than one burst width, is acquired in the first DMA transfer (DMA transfer A) and the fourth DMA transfer (DMA transfer D). This indicates that invalid data for block processing to be unused in the block processing is stored in the buffer 30 in the DMA transfer A and the DMA transfer D.

The valid data determination unit 50 determines whether or not invalid data for block processing to be unused in the block processing is likely to be stored in the buffer 30 by a current DMA transfer based on the number of DMA transfers when the DMA I/F 10 acquires data for block processing. More specifically, the number of DMA transfers by the DMA I/F 10 is counted, and the counted number of DMA transfers is compared to the predetermined number of DMA transfers in a block to be currently processed. If the counted number of DMA transfers is one (that corresponds to a first transfer) (for example, Count Value=0) and is the same as the predetermined number of DMA transfers (for example, Count Value= (Predetermined Number−1)), invalid data for block processing is determined to be likely to be stored in the buffer 30 in the currently counted DMA transfer. Thereby, for example, as shown in FIG. 4, if all data for block processing is acquired by 4 DMA transfers, invalid data for block processing is determined to be likely to be stored in the buffer 30 during the DMA transfer A (the first DMA transfer) and the DMA transfer D (the last DMA transfer).

The valid data determination unit 50 calculates an area of valid data for block processing (hereinafter referred to as a "valid data area") to be used in the block processing for each burst width in the DMA transfer of invalid data for block processing determined to be likely to be stored in the buffer 30. The valid data area is calculated based on values such as an image size of data for block processing, standard coordinates of block processing (for example, coordinates of an upper-left end of a block), a block size, a storage format of data for block processing, and the like. For example, in block processing of a first block shown in FIG. 4, only some (a fraction of) data for block processing in first and fourth burst widths is valid data, and all data for block processing in second and third burst widths is valid data. The valid data determination unit 50 calculates a valid data area within each burst width. The valid data determination unit 50 outputs the valid data area calculated in the DMA transfer of invalid data for block processing determined to be stored in the buffer 30 to the state management unit 40 as the valid data area information.

Based on the valid data area information input from the valid data determination unit 50, the state management unit 40 outputs information for determining whether data for block processing acquired by the DMA I/F 10 in a DMA transfer is valid data to be used in the block processing or invalid data to be unused in the block processing to the write control unit 20 as the valid data information.

The valid data information output by the state management unit 40 to the write control unit 20 indicates whether the data for block processing is valid or invalid data for all data for block processing, but storing by the write control unit 20 in division buffers is performed in units of division buffers. Accordingly, because the write control unit 20 determines whether or not data for block processing input from the DMA I/F 10 is stored in units of division buffers, a control operation is performed so that data for block processing is not stored in a corresponding division buffer if the data for block processing stored in the division buffer is all invalid. Thus, although some invalid data for block processing is included within the division buffer, this does not mean that all data for block processing stored in the division buffer becomes invalid data for block processing.

For example, invalid data for block processing is stored in part of a first division buffer in the DMA transfer A of the first block in the example of storage of data for block processing shown in FIG. 4. In addition, although valid data for block processing is stored in part of the first division buffer in the DMA transfer of the first block, this does not mean that invalid data for block processing is stored in the second to fourth division buffers. In addition, for example, invalid data for block processing is stored in part of the fourth division buffer in the DMA transfer D of the second block shown in FIG. 4. In addition, although valid data for block processing is stored in part of the fourth division buffer in the DMA transfer A of the second block, this does not mean that invalid data for block processing is stored in the first to third division buffers.

Figure 13:
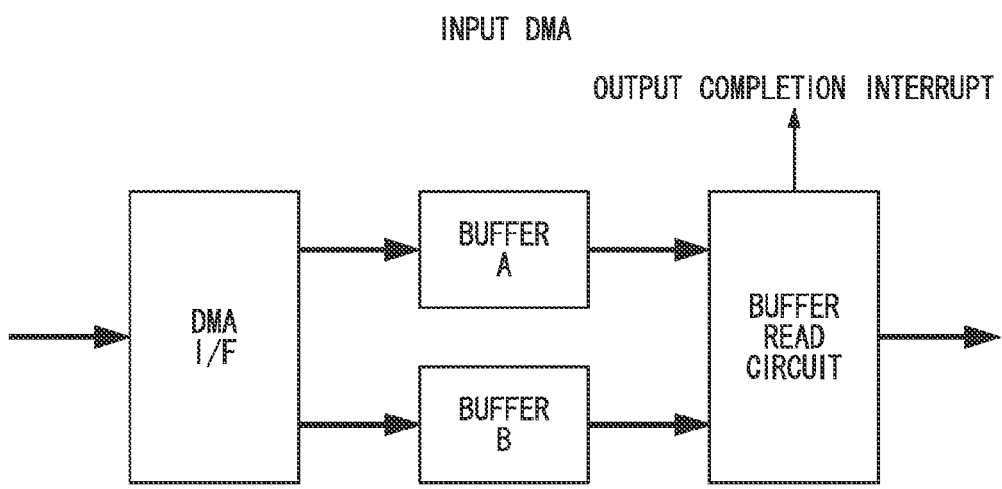
FIG. 13 is a block diagram illustrating an example of a schematic configuration of a data processing apparatus in accordance with the related art.
Figure 14A:
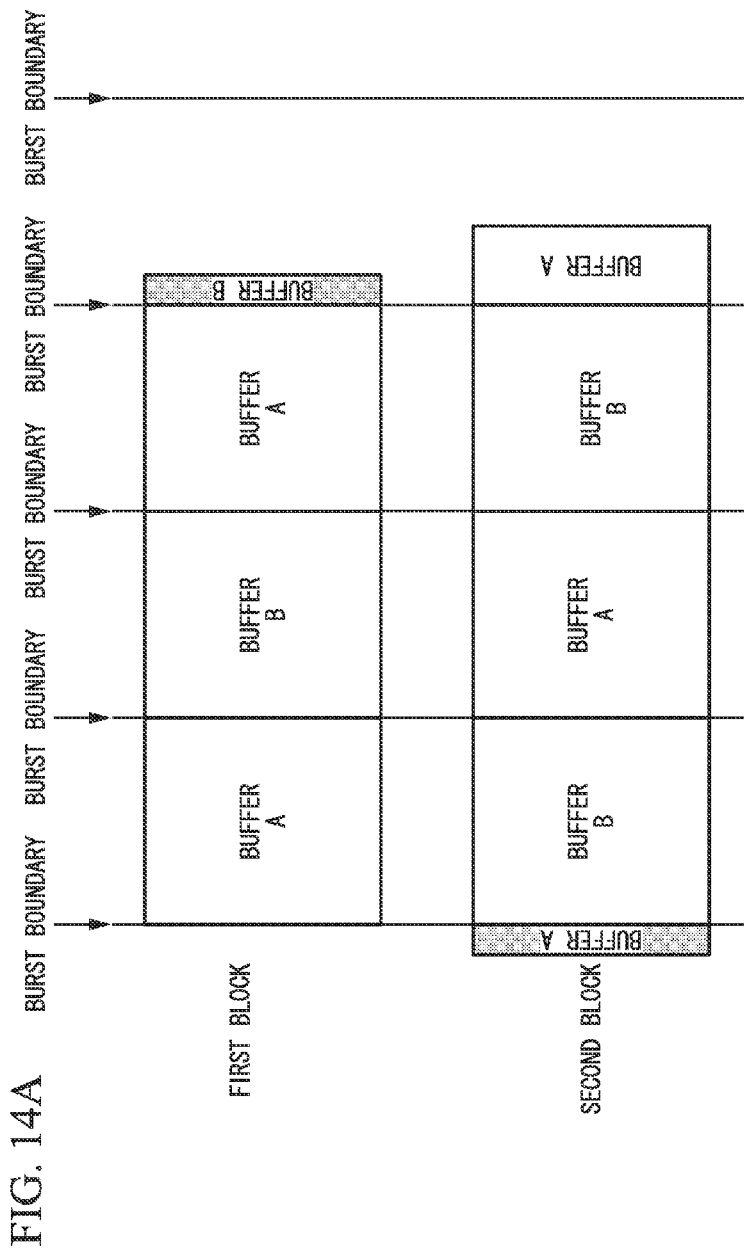
FIG. 14A is a diagram illustrating an example when data is stored in the buffer included in the data processing apparatus in accordance with the related art.
Figure 14B:
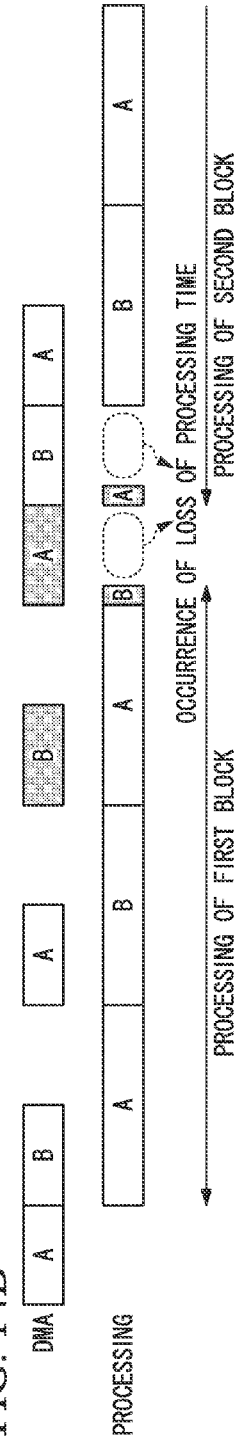
FIG. 14B is a diagram illustrating an example of processing timings for each block in accordance with the related art.
Figure 15:
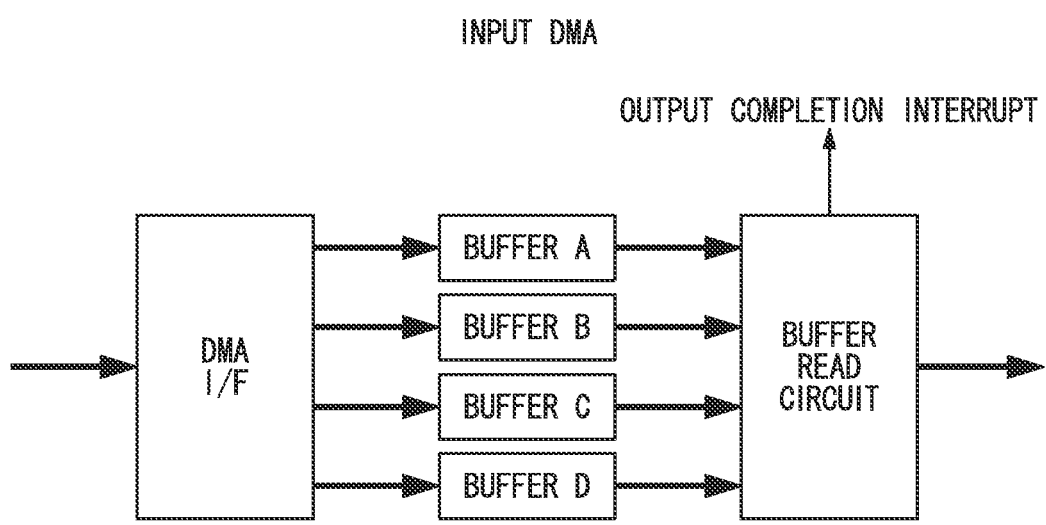
FIG. 15 is a block diagram illustrating another example of a schematic configuration of the data processing apparatus in accordance with the related art.

As described above, data for block processing is managed in units of division buffers, so that it is possible to avoid much data for block processing stored in the buffer from being invalid data for block processing as in the data processing apparatus of the related art shown in FIG. 13.

Units of division buffers into which a storage area of the buffer 30 is divided can be configured as units of vertical lines shown in FIG. 2. In this case, the write control unit 20 can store only valid data for block processing in a division buffer by storing data for block processing in the division buffer based on the valid data information included in the empty buffer information input from the state management unit 40.

As described above, even when a burst boundary of data for block processing burst-transferred from the external memory 200 is not consistent with a boundary of a block to be processed in the data processing apparatus 100 in accordance with the first preferred embodiment, it is possible to efficiently use the storage area of the buffer 30 without storing much invalid data for block processing acquired by the DMA I/F 10 in the buffer 30. Thereby, the data processing apparatus 100 in accordance with the first preferred embodiment can process data without easily increasing the buffer size.

Figure 5:
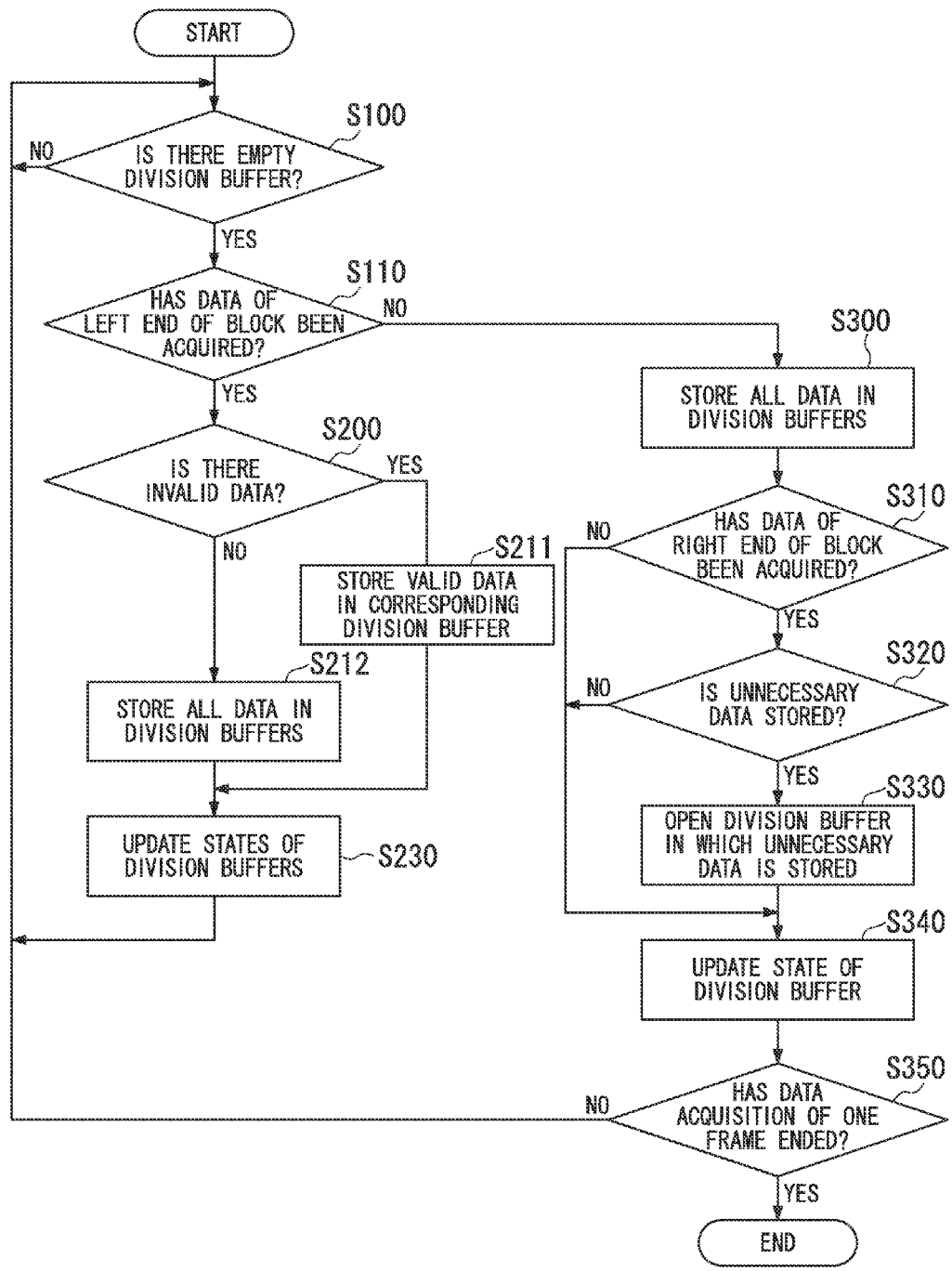
FIG. 5 is a flowchart illustrating a procedure of an operation in which data is stored in the buffer included in the data processing apparatus in accordance with the first preferred embodiment of the present invention.

Here, a method of managing the buffer 30 included in the data processing apparatus 100 in accordance with the first preferred embodiment will be described. First, a method of managing the buffer 30 when data for block processing is stored in the buffer 30 will be described. FIG. 5 is a flowchart illustrating a procedure of an operation in which data for block processing is stored in the buffer 30 included in the data processing apparatus 100 in accordance with the first preferred embodiment of the present invention.

If an operation of acquiring data for block processing in the data processing apparatus 100 is initiated, the state management unit 40 first checks whether or not there is a division buffer of an empty state within the buffer 30 in step S100. If there is no division buffer of the empty state within the buffer 30, step S100 is iterated. In addition, if there is the division buffer of the empty state within the buffer 30, the valid data determination unit 50 determines whether or not data for block processing acquired by the DMA I/F 10 is data of a left end of a block in step S110.

If the determination result of the valid data determination unit 50 indicates that the data for block processing acquired by the DMA I/F 10 is the data of the left end of the block in step S110, the valid data determination unit 50 calculates a valid data area and outputs valid data area information to the state management unit 40. The state management unit 40 outputs the empty buffer information including the valid data information for determining whether the data for block processing acquired by the DMA I/F 10 is valid or invalid data to the write control unit 20 based on the valid data area information input from the valid data determination unit 50.

Subsequently, in step S200, the write control unit 20 determines whether or not there is invalid data for block processing to be unused in current block processing within the data for block processing input from the DMA I/F 10 based on the valid data information included in the empty buffer information input from the state management unit 40. If the determination result indicates that there is the invalid data for block processing within the data for block processing input from the DMA I/F 10, the write control unit 20 determines a division buffer within the buffer 30 to which valid data for block processing is written based on the empty buffer information input from the state management unit 40 in step S211. The valid data for block processing is stored in a corresponding division buffer of the empty state. In addition, if writing of the valid data for block processing to the division buffer is completed, the write control unit 20 outputs write completion information to the state management unit 40.

In addition, if the determination result of step S200 indicates that there is no invalid data for block processing within the data for block processing input from the DMA I/F 10, the write control unit 20 determines division buffers within the buffer 30 to which all input data for block processing is written based on the empty buffer information input from the state management unit 40 in step S212. All data for block processing is stored in the division buffers of the empty state. In addition, if writing of all the data for block processing to the division buffers is completed, the write control unit 20 outputs the write completion information to the state management unit 40.

Subsequently, in step S230, the state management unit 40 updates the states of the division buffers within the buffer 30, that is, the states of the division buffers in which data for block processing has been stored, based on the write completion information input from the write control unit 20. An operation of storing data for block processing acquired by the DMA I/F 10 is continued by returning to step S100.

In addition, if the determination result of the valid data determination unit 50 in step S110 indicates that the data for block processing acquired by the DMA I/F 10 is not the data of the left end of the block, the write control unit 20 determines division buffers within the buffer 30 to which all the input data for block processing is written based on the empty buffer information input from the state management unit 40 in step S300. All the data for block processing is stored in the division buffers of the empty state. In addition, if writing of all the data for block processing to the division buffers is completed, the write control unit 20 outputs the write completion information to the state management unit 40.

Subsequently, in step S310, the valid data determination unit 50 determines whether or not data for block processing acquired by the DMA I/F 10 is data of a right end of a block. If the data for block processing acquired by the DMA I/F 10 is not the data of the right end of the block, the process proceeds to step S340. In addition, if the data for block processing acquired by the DMA I/F 10 is the data of the right end of the block, the valid data determination unit 50 calculates a valid data area and outputs valid data area information to the state management unit 40.

Subsequently, in step S320, the state management unit 40 determines whether or not unnecessary (invalid) data for block processing to be unused in current block processing is stored in each division buffer within the buffer 30 based on the valid data area information input from the valid data determination unit 50. If the unnecessary data for block processing is not stored within the buffer 30, the process proceeds to step S340. In addition, if the unnecessary data for block processing is stored within the buffer 30, the state management unit 40 opens a division buffer in which the unnecessary data for block processing is stored (or changes the division buffer to the empty state) in step S330.

Subsequently, in step S340, the state management unit 40 updates the state of the division buffer within the buffer 30, that is, the state of the division buffer in which data for block processing has been stored, based on the write completion information input from the write control unit 20.

Subsequently, in step S350, the valid data determination unit 50 checks whether or not the acquisition of data for block processing of one frame has ended. If the acquisition of data for block processing of one frame has not ended, the process returns to step S100 in which an operation of storing data for block processing acquired by the DMA I/F 10 is continued. If the acquisition of the data for block processing of the one frame has ended, the operation of storing the data for block processing in the buffer 30 ends.

The case where a division buffer in which unnecessary data for block processing is stored is opened in step S330 if the data for block processing acquired by the DMA I/F 10 is the data of the right end of the block (step S310 is YES), and the unnecessary data for block processing is stored in the division buffer (step S320 is YES) has been described in the procedure of the operation of storing the data for block processing shown in FIG. 5 in the buffer 30. However, the operation of storing in the buffer 30 when the data for block processing acquired by the DMA I/F 10 is the data of the right end of the block is not limited to a method of opening the division buffer after data for block processing is stored in the buffer 30 once. For example, as in step S200, the write control unit 20 determines whether or not there is invalid data for block processing to be unused in current block processing within the data for block processing input from the DMA I/F 10. Based on this determination result, as in step S211, the write control unit 20 can perform an operation of determining a division buffer within the buffer 30 to which valid data for block processing is written and storing the valid data for block processing in a corresponding division buffer of the empty state.

Figure 6:
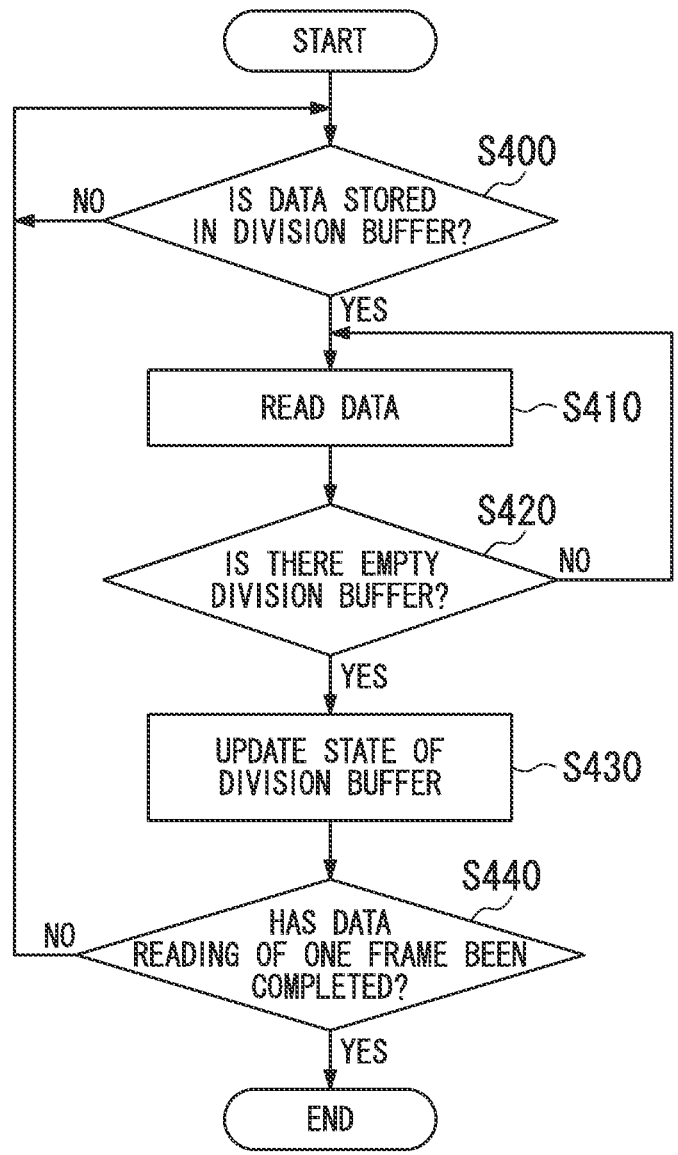
FIG. 6 is a flowchart illustrating a procedure of an operation of reading data stored in the buffer included in the data processing apparatus in accordance with the first preferred embodiment of the present invention.

Next, a method of managing the buffer 30 when data for block processing stored in the buffer 30 is read will be described. FIG. 6 is a flowchart illustrating a procedure of an operation of reading data for block processing stored in the buffer 30 included in the data processing apparatus 100 in accordance with the first preferred embodiment of the present invention.

If a block processing operation is initiated in the data processing apparatus 100, the state management unit 40 first checks whether or not data for block processing is stored in a division buffer within the buffer 30 in step S400. If the data for block processing is not stored in the division buffer within the buffer 30, step S400 is iterated. In addition, if the data for block processing is stored in the division buffer within the buffer 30, the read control unit 60 reads the data for block processing of one vertical line, performs block processing of the read data, and outputs the block-processed data outside the data processing apparatus 100 in step S410. In addition, if reading of the data for block processing is completed, the read control unit 60 outputs the read completion information to the state management unit 40.

Subsequently, in step S420, the state management unit 40 checks whether or not there is a division buffer of the empty state within the buffer 30, that is, whether or not all the data for block processing stored in the division buffer has been used in the block processing, based on the read completion information input from the read control unit 60. If there is no division buffer of the empty state within the buffer 30, reading and block processing of the data for block processing by the read control unit 60 are continued by returning to step S410. In addition, if there is the division buffer of the empty state within the buffer 30, the state management unit 40 updates the state of the division buffer within the buffer 30, that is, the state of the division buffer from which the data for block processing has been read, based on the read completion information input from the read control unit 60 in step S430.

Subsequently, in step S440, the state management unit 40 checks whether or not block processing of data for block processing of one frame has been completed. If the block processing of data for block processing of the one frame has not been completed, the block processing of data for block processing stored in the buffer 30 is continued by returning to step S400. If the block processing of data for block processing of the one frame has been completed, an operation of the block processing of data for block processing stored in the buffer 30 ends.

Next, an operation of the buffer 30 included in the data processing apparatus 100 in accordance with the first preferred embodiment will be described. FIGS. 7A to 7L and FIGS. 8M to 8Z are diagrams illustrating an example of the operation of the buffer 30 included in the data processing apparatus 100 in accordance with the first preferred embodiment of the present invention. The operation of the buffer 30 shown in FIGS. 7A to 7L and FIGS. 8M to 8Z will be described with reference to the example of storage of the data for block processing shown in FIG. 4. In addition, the buffer 30 included in the data processing apparatus 100 is configured so that a total storage capacity of the buffer 30 is divided into 8 division buffers as shown in FIG. 3. As shown in FIG. 4, the DMA I/F 10 is configured so that one burst width is a width of four division buffers and valid data for block processing is arranged across a burst boundary when the DMA I/F 10 performs a burst transfer. That is, the operation of the buffer 30 shown in FIGS. 7A to 7L and FIGS. 8M to 8Z is an example in which the DMA I/F 10 acquires data for block processing of four division buffers of which a flow of data is continuous in the horizontal direction in one burst transfer from the external memory 200, and the write control unit 20 stores the data for block processing input from the DMA I/F 10 in the four continuous division buffers.

In the description of the operation of the buffer 30 shown in FIGS. 7A to 7L and FIGS. 8M to 8Z, it is assumed that the amount of valid data for block processing is 1, that is, only one vertical line is valid, in the DMA transfer D of the first block and the DMA transfer A of the second block shown in FIG. 4, and the amount of invalid data for block processing is 1, that is, only one vertical line is invalid, in the DMA transfer A of the first block and the DMA transfer D of the second block.

Figure 7A:
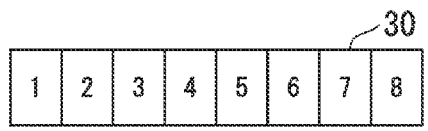
FIGS. 7A to 7L and FIGS. 8M to 8Z are diagrams illustrating an example of operation of the buffer included in the data processing apparatus in accordance with the first preferred embodiment of the present invention.

First, the operation of the data processing apparatus 100 is initiated and the DMA I/F 10 acquires data for block processing by the DMA transfer A of the first block. Initially, the empty buffer information recognized by the state management unit 40 indicates that all division buffers (division buffers 1 to 8) are in the empty state as shown in FIG. 7A.

Figure 7B:
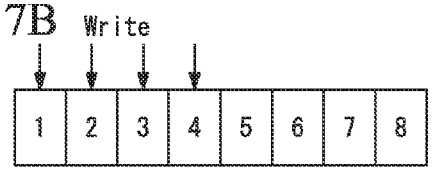

Based on the empty buffer information input from the state management unit 40, the write control unit 20 determines division buffers, which store data for block processing acquired by the DMA transfer A of the first block, as the division buffers 1 to 4. As shown in FIG. 7B, the write control unit 20 stores the data for block processing acquired by the DMA transfer A of the DMA I/F 10 in four division buffers in the order of Division Buffer 1→Division Buffer 2→Division Buffer 3→Division Buffer 4 (see steps S110 to S212 of FIG. 5).

Invalid data for block processing to be unused in current block processing (of the first block) is likely to be included in data for block processing of a left end of an initially acquired block. Based on valid data information included in the empty buffer information input from the state management unit 40, the write control unit 20 determines a division buffer within the buffer 30 to which valid data for block processing included in data for block processing of the first block input from the DMA I/F 10 is written. Here, because the number of invalid data for block processing in the DMA transfer A of the first block is 1, all data for block processing acquired by the DMA transfer A of the first block is stored in the division buffers 1 to 4 and only one first vertical line within data for block processing stored in the division buffer 1 is invalid data for block processing.

When writing of data for block processing to the division buffers 1 to 4 has been completed, the write control unit 20 outputs the write completion information to the state management unit 40. Thereby, as shown in FIG. 7C, the state management unit 40 sets the states of the division buffers 1 to 4 to the in-use state, that is, a state in which no other data is writable to the division buffers.

After the data for block processing is stored in the division buffers 1 to 4, the read control unit 60 determines division buffers from which the data for block processing is read as the division buffers 1 to 4 based on the valid buffer information input from the state management unit 40. As shown in FIG. 7D, the stored data for block processing is read in order from the division buffer 1, and the read data for block processing is output after the block processing (see steps S400 to S410 of FIG. 6). Because one first vertical line stored in the division buffer 1 is invalid data for block processing, reading and block processing of data for block processing are performed from a second vertical line stored in the division buffer 1 in a state in which reading and block processing of the invalid data are not performed.

Figure 7C:
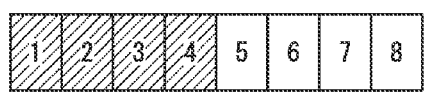
Figure 7D:
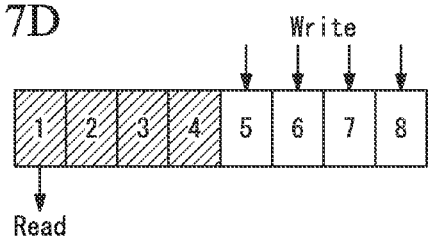

In addition, the empty buffer information recognized by the state management unit 40 indicates that the division buffers 5 to 8 are in the empty state as shown in FIG. 7C. The write control unit 20 determines division buffers, which store data for block processing acquired by the DMA transfer B of a first block, as the division buffers 5 to 8 based on the empty buffer information input from the state management unit 40. As shown in FIG. 7D, the write control unit 20 stores the data for block processing acquired by the DMA transfer B of the DMA I/F 10 in four division buffers in the order of Division Buffer 5→Division Buffer 6→Division Buffer 7→Division Buffer 8.

The data for block processing acquired by the DMA transfer B is neither a left end nor a right end of a block. That is, invalid data for block processing to be unused in current block processing (of the first block) is not likely to be included in the data for block processing acquired by the DMA transfer B. Accordingly, the write control unit 20 stores all the data for block processing acquired by the DMA transfer B in the division buffers 5 to 8 (see steps S110 and S300 to S340 of FIG. 5).

Figure 7E:

When writing of data for block processing to the division buffers 5 to 8 has been completed, the write control unit 20 outputs the write completion information to the state management unit 40. Thereby, the state management unit 40 sets the states of the division buffers 5 to 8 to the in-use state as shown in FIG. 7E. As shown in FIG. 7E, the empty buffer information recognized by the state management unit 40 indicates that all the division buffers 1 to 8 are in the in-use state. Thereby, the DMA transfer C by the DMA I/F 10 is in a waiting state (see step S100 of FIG. 5).

Figure 7F:
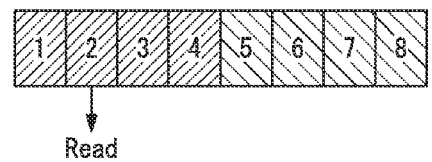

Every time reading from one division buffer and block processing are completed, the read control unit 60 outputs the read completion information to the state management unit 40 (see steps S410 to S430 of FIG. 6). Accordingly, when reading and block processing of data for block processing stored in the division buffer 1 have been completed, the read control unit 60 outputs the read completion information to the state management unit 40. As shown in FIG. 7F, the read control unit 60 continues reading and block processing of data for block processing stored in the division buffer 2 continuously based on the valid buffer information input from the state management unit 40.

Figure 7G:
Figure 7H:
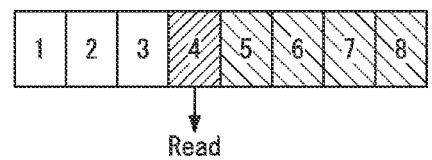

In addition, as shown in FIG. 7G, the state management unit 40 sets the state of the division buffer 1 to the empty state, that is, a state in which other data is writable to the division buffer, based on the read completion information input from the read control unit 60.

Figure 7I:
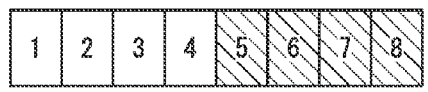
Figure 7J:
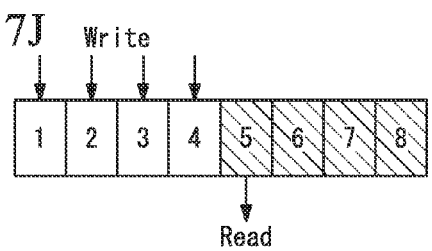

Thereafter, the read control unit 60 sequentially performs reading and block processing of data for block processing stored in the division buffers 2 to 4. In addition, every time reading from one division buffer and block processing are completed, the read control unit 60 outputs the read completion information to the state management unit 40 (see FIG. 7H). As shown in FIG. 7J, the read control unit 60 continues reading and block processing of data for block processing stored in the division buffer 5 continuously based on the valid buffer information input from the state management unit 40.

In addition, the state management unit 40 sequentially sets the states of corresponding division buffers to the empty state every time the read completion information indicating that the reading and block processing of the data for block processing stored in the division buffers 2 to 4 have been completed is input from the read control unit 60. If the read completion information for the division buffer 4 has been input from the read control unit 60, the state management unit 40 sets the state of the division buffer 4 to the empty state. Thereby, the empty buffer information recognized by the state management unit 40 indicates that the division buffers 1 to 4 are in the empty state as shown in FIG. 7I. That is, a state in which a storage capacity for storing the data for block processing acquired by the DMA transfer C is empty is reached. Thereby, the DMA I/F 10 resumes the waiting DMA transfer C.

The write control unit 20 determines division buffers, which store data for block processing acquired by the DMA transfer C of the first block, as the division buffers 1 to 4 based on the empty buffer information input from the state management unit 40. As shown in FIG. 7J, the write control unit 20 stores the data for block processing acquired by the DMA transfer C of the DMA I/F 10 in four division buffers in the order of Division Buffer 1→Division Buffer 2→Division Buffer 3→Division Buffer 4.

Because the data for block processing acquired by the DMA transfer C is neither a left end nor a right end of a block, invalid data for block processing to be unused in current block processing (of the first block) is not likely to be included. Accordingly, the write control unit 20 stores all the data for block processing acquired by the DMA transfer C in the division buffers 1 to 4.

Figure 7K:
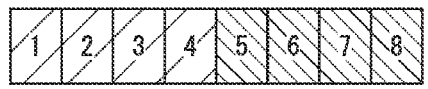

When writing of data for block processing to the division buffers 1 to 4 has been completed, the write control unit 20 outputs the write completion information to the state management unit 40. Thereby, the state management unit 40 sets the states of the division buffers 1 to 4 to the in-use state as shown in FIG. 7K. Thereby, because all the division buffers 1 to 8 within the buffer 30 are in the in-use state, the DMA transfer D by the DMA I/F 10 is in a waiting state.

In addition, the read control unit 60 continues reading and block processing of data for block processing stored in the division buffers 5 to 8 based on the valid buffer information input from the state management unit 40. Every time reading from one division buffer and block processing are completed, the read control unit 60 outputs the read completion information to the state management unit 40 (see FIG. 7L).

Figure 8M:
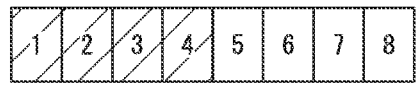

If the read completion information indicating that reading and block processing of data for block processing stored in the division buffer 8 have been completed is input from the read control unit 60, the station management unit 40 sets the state of the division buffer 8 to the empty state as shown in FIG. 8M. Thereby, the empty buffer information recognized by the state management unit 40 indicates that the division buffers 5 to 8 are in the empty state (see FIG. 8M).

Figure 8N:
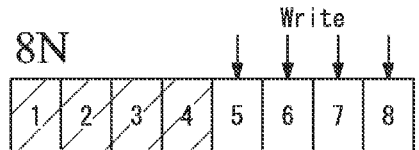

Thereby, because a storage capacity for storing data for block processing acquired by the DMA transfer D is in the empty state, the DMA I/F 10 resumes the waiting DMA transfer D. Based on the empty buffer information input from the state management unit 40, the write control unit 20 determines division buffers, which store data for block processing acquired by the DMA transfer D of the first block, as the division buffers 5 to 8. As shown in FIG. 8N, the write control unit 20 stores the data for block processing acquired by the DMA transfer D of the DMA I/F 10 in four division buffers in the order of Division Buffer 5→Division Buffer 6→Division Buffer 7→Division Buffer 8.

Figure 8O:
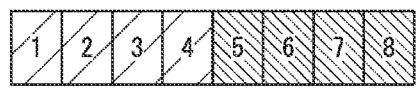

When writing of data for block processing to the division buffers 5 to 8 has been completed, the write control unit 20 outputs the write completion information to the state management unit 40. Thereby, the state management unit 40 sets the states of the division buffers 5 to 8 to the in-use state as shown in FIG. 8O. In addition, the read control unit 60 continues reading and block processing of data for block processing stored in the division buffer 1 based on the valid buffer information input from the state management unit 40 (see FIG. 8P).

The data for block processing acquired by the DMA transfer D is data for block processing of a right end of a block. That is, unnecessary data for block processing to be unused in current block processing (of the first block) is likely to be included in the data for block processing of the right end of the block acquired by the DMA transfer D. Here, because the amount of valid data for block processing in the DMA transfer D of the first block is 1, only one first vertical line of the division buffer 5 is valid data for block processing. Thus, as shown in FIG. 8Q, based on the valid data area information input from the valid data determination unit 50, the state management unit 40 opens the division buffers 6 to 8 in which unnecessary data for block processing is stored, that is, makes a change to the empty state in which other data is writable to the division buffers (see steps S310 to S330 of FIG. 5).

When the write control unit 20 has completed writing of data for block processing to the division buffers 5 to 8 or the state management unit 40 has opened the division buffers 6 to 8, the DMA I/F 10 and the write control unit 20 of the data processing apparatus 100 are reset and a preparation for a DMA transfer of data necessary for block processing of the second block to be processed next from the external memory 200 is initiated. However, as shown in FIG. 8Q, the empty buffer information recognized by the state management unit 40 indicates that division buffers in the empty state are only the division buffers 6 to 8. Accordingly, a storage capacity for storing data for block processing acquired by the DMA I/F 10 in the DMA transfer A of the second block, that is, four division buffers, is not in the empty state. Thus, the DMA transfer A of the second block by the DMA I/F 10 is in the waiting state.

When reading and block processing of data for block processing stored in the division buffer 1 have been completed, the read control unit 60 outputs the read completion information to the state management unit 40. As shown in FIG. 8R, the read control unit 60 continues reading and block processing of data for block processing stored in the division buffer 2 continuously based on the valid buffer information input from the state management unit 40.

Figure 8P:
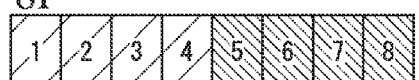
Figure 8Q:
Figure 8R:
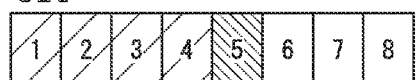
Figure 8S:
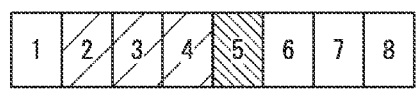

In addition, as shown in FIG. 8S, the state management unit 40 sets the state of the division buffer 1 to the empty state based on the read completion information input from the read control unit 60. Thereby, the empty buffer information recognized by the state management unit 40 indicates that the division buffer 1 and the division buffers 6 to 8 are in the empty state. That is, four division buffers for storing data for block processing acquired by the DMA transfer A of the second block are in the empty state. The DMA I/F 10 resumes the waiting DMA transfer A of the second block.

Based on the empty buffer information input from the state management unit 40, the write control unit 20 determines division buffers, which store data for block processing acquired by the DMA transfer A of the second block, as the division buffers 6 to 8 and the division buffer 1. The write control unit 20 prepares to store the data for block processing acquired by the DMA transfer A of the second block of the DMA I/F 10 in four division buffers in the order of Division Buffer 6→Division Buffer 7→Division Buffer 8→Division Buffer 1.

Figure 8T:
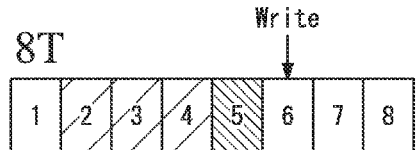

However, there is a possibility that the data for block processing acquired by the DMA transfer A of the second block is data for block processing of a left end of a block and invalid data for block processing to be unused in the block processing of the second block is included. Based on the valid data information included in the empty buffer information input from the state management unit 40, the write control unit 20 determines a division buffer within the buffer 30 to which valid data for block processing included in the data for block processing of the second block input from the DMA I/F 10 is written. Here, because the amount of valid data for block processing in the DMA transfer A of the second block is 1, only one first vertical line of the division buffer 6 is valid data for block processing. Thus, as shown in FIG. 8T, the write control unit 20 controls only data for block processing corresponding to the division buffer 6 to be stored. According to control as described above, the DMA transfer A of the second block shown in FIG. 4 is performed in the same way as before in a state in which the division buffers 6 to 8 and the division buffer 1 are empty, so that an operation of storing valid data for block processing in the division buffer 1 is avoided.

Figure 8U:
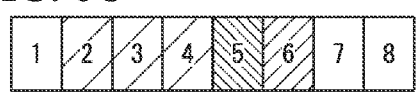

When writing of data for block processing to the division buffer 6 has been completed, the write control unit 20 outputs the write completion information to the state management unit 40. Thereby, as shown in FIG. 8U, the state management unit 40 sets the state of the division buffer 6 to the in-use state. Here, as shown in FIG. 8U, the empty buffer information recognized by the state management unit 40 indicates that there are division buffers (the division buffers 7, 8, and 1) in the empty state. However, because four division buffers, which store the data for block processing acquired by the DMA I/F 10 in the DMA transfer B of the second block, are not in the empty state, the DMA transfer B of the second block by the DMA I/F 10 is in the waiting state.

Figure 8V:
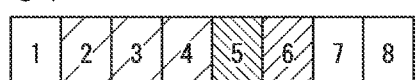

In addition, the read control unit 60 continues reading and block processing of the data for block processing stored in the division buffers 2 to 4 based on the valid data information input from the state management unit 40. Accordingly, when reading from the division buffer 2 and block processing have been completed, the read control unit 60 outputs the read completion information to the state management unit 40. As shown in FIG. 8V, the read control unit 60 continues reading and block processing of the data for block processing stored in the division buffer 3 continuously based on the valid buffer information input from the state management unit 40.

Figure 8W:
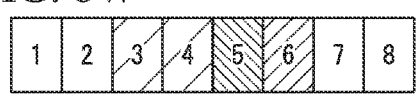

When the read completion information for the division buffer 2 has been input from the read control unit 60, the state management unit 40 sets the state of the division buffer 2 to the empty state as shown in FIG. 8W. Thereby, the division buffers 1, 2, 7, and 8, that is, four division buffers for storing data for block processing acquired by the DMA transfer B of the second block, are set to the empty state. The DMA I/F 10 resumes the waiting DMA transfer B of the second block.

Figure 8X:
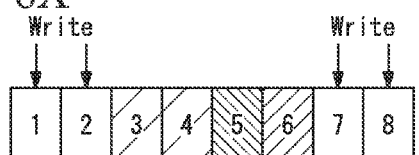

The write control unit 20 determines division buffers, which store data for block processing acquired by the DMA transfer B of the second block, as the division buffers 1, 2, 7, and 8 based on the empty buffer information input from the state management unit 40. As shown in FIG. 8X, the write control unit 20 stores the data for block processing acquired by the DMA transfer B of the second block of the DMA I/F 10 in four division buffers in the order of Division Buffer 7→Division Buffer 8→Division Buffer 1→Division Buffer 2.

Because the data for block processing acquired by the DMA transfer B of the second block is neither a left end nor a right end of a block, invalid data for block processing to be unused in the block processing of the second block is not likely to be included. Accordingly, the write control unit 20 stores all the data for block processing acquired by the DMA transfer B of the second block in the division buffers 1, 2, 7, and 8.

Figure 8Y:

When writing of data for block processing to the division buffers 1, 2, 7, and 8 has been completed, the write control unit 20 outputs the write completion information to the state management unit 40. Thereby, the state management unit 40 sets the states of the division buffers 1, 2, 7, and 8 to the in-use state as shown in FIG. 8Y. Thereby, because all the division buffers 1 to 8 within the buffer 30 are in the in-use state, the DMA transfer C of the second block by the DMA I/F 10 is in the waiting state.

Figure 8Z:
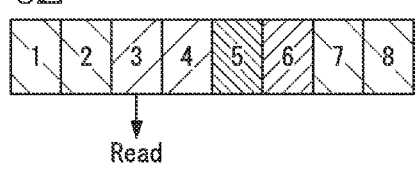

In addition, as shown in FIG. 8Z, the read control unit 60 continues reading and block processing of data for block processing stored in the division buffers 3 and 4 based on the valid buffer information input from the state management unit 40.

Thereafter, likewise, every time four division buffers, which store data for block processing acquired by the DMA I/F 10, are in the empty state, the write control unit 20 sequentially stores the acquired data for block processing in the division buffers in the empty state. As described above, when data for block processing is a left or right end of a block to be processed, the write control unit 20 controls the division buffers, which store the data for block processing, in units of division buffers within the buffer 30. The read control unit 60 reads data for block processing stored in the division buffers. The block processing is performed in a subsequent stage of the data processing apparatus 100 in accordance with the first preferred embodiment.

As described above, in the data processing apparatus 100 in accordance with the first preferred embodiment, a total storage capacity of the buffer 30 is divided into a plurality of division buffers for each predetermined storage capacity, and acquired data for block processing is sequentially stored every time states of division buffers of which the number corresponds to data for block processing acquired by one DMA transfer of the DMA I/F 10 are in the empty state. Thereby, it is possible to avoid much data for block processing stored in the buffer 30 from being invalid data for block processing even when a burst boundary of data for block processing burst-transferred from the external memory 200 is not consistent with a boundary of a block to be processed. Thereby, the data processing apparatus 100 in accordance with the first preferred embodiment can process data without easily increasing the buffer size.

Figure 9:
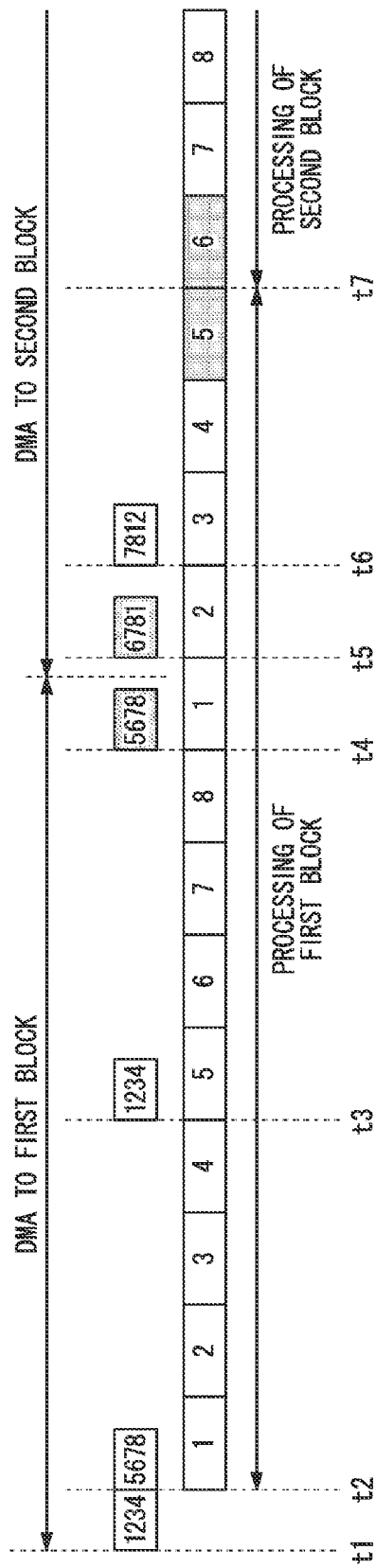
FIG. 9 is a timing chart illustrating an example of processing timings of each block in the data processing apparatus in accordance with the first preferred embodiment of the present invention.

Next, processing timings in the data processing apparatus 100 in accordance with the first preferred embodiment will be described. FIG. 9 is a timing chart illustrating an example of processing timings of each block in the data processing apparatus 100 in accordance with the first preferred embodiment of the present invention. In the data processing apparatus 100, the read control unit 60 performs block processing by sequentially reading data for block processing stored in each division buffer within the buffer 30. Here, the processing timings of the data processing apparatus 100 when the total storage capacity of the buffer 30 is divided into 8 division buffers as shown in FIG. 3 and the DMA I/F 10 acquires data for block processing across a burst boundary as in the example of storage of data for block processing shown in FIG. 4 will be described. Hereinafter, a description will be given with reference to an operation example of the buffer 30 in which data for block processing is stored in the 8 division buffers virtually connected in the ring shape as shown in FIGS. 7A to 7L and FIGS. 8M to 8Z.

First, at timing t1, the DMA I/F 10 acquires data for block processing of four division buffers by one DMA transfer (DMA transfer A) of a first block. The write control unit 20 stores the data for block processing acquired by the DMA transfer A of the first block in division buffers 1 to 4 (see FIGS. 7B and 7C).

If the write control unit 20 completes writing of the data for block processing to the division buffers 1 to 4, the DMA I/F 10 continuously acquires data for block processing of the four division buffers in a second DMA transfer (DMA transfer B) of the first block at timing t2. The write control unit 20 stores the data for block processing acquired by the DMA transfer B of the first block in division buffers 5 to 8 (see FIG. 7D).

In addition, the read control unit 60 sequentially reads the data for block processing acquired by the DMA transfer A stored in the division buffers 1 to 4 from timing t2 after data for block processing is stored in the division buffers 1 to 4, performs block processing of the read data, and outputs the block-processed data (see FIGS. 7D to 7H).

Thereafter, if the read control unit 60 completes the block processing of the data for block processing acquired by the DMA transfer A, the DMA I/F 10 acquires data for block processing of four division buffers by a third DMA transfer (DMA transfer C) of the first block at timing t3. The write control unit 20 stores the data for block processing acquired by the DMA transfer C of the first block in the division buffers 1 to 4 (see FIGS. 7I and 7J).

Figure 7L:
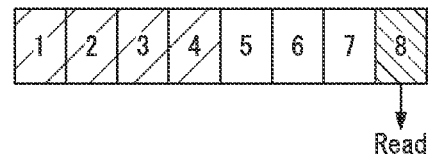

Then, the read control unit 60 sequentially reads the data for block processing acquired by the DMA transfer B stored in the division buffers 5 to 8 from timing t3, performs block processing of the read data, and outputs the block-processed data continuously (see FIGS. 7J to 7L).

Thereafter, if the read control unit 60 completes the block processing of the data for block processing acquired by the DMA transfer B, the DMA I/F 10 acquires data for block processing of four division buffers by a fourth DMA transfer (DMA transfer D) of the first block at timing t4. The write control unit 20 stores the data for block processing acquired by the DMA transfer D of the first block in the division buffers 5 to 8 (see FIGS. 8M and 8N).

Because unnecessary data for block processing of the first block is included in the data for block processing acquired by the DMA transfer D, the state management unit 40 opens the division buffers 6 to 8 storing the unnecessary data for block processing (see FIGS. 8O to 8Q).

Next, the read control unit 60 sequentially reads the data for block processing acquired by the DMA transfer C stored in the division buffers 1 to 4 from timing t4, performs block processing of the read data for block processing, and outputs the block-processed data continuously (see FIGS. 8N to 8Z).

When the write control unit 20 has completed writing of data for block processing to the division buffers 5 to 8 or the state management unit 40 has opened the division buffers 6 to 8, the DMA I/F 10 and the write control unit 20 of the data processing apparatus 100 are reset and a preparation for a DMA transfer of data necessary for block processing of a second block to be processed next from the external memory 200 is initiated.

Thereafter, if the read control unit 60 completes block processing of the data for block processing acquired by the DMA transfer C stored in the division buffer 1, the DMA I/F 10 acquires data for block processing of four division buffers by a first DMA transfer (DMA transfer A) of the second block at timing t5.

Because invalid data for block processing of the second block is included in data for block processing acquired by the DMA transfer A of the second block, the write control unit 20 stores only valid data for block processing of the second block in the division buffer 6 (see FIG. 8T).

Thereafter, if the read control unit 60 completes block processing of the data for block processing acquired by the DMA transfer C stored in the division buffer 2, the DMA I/F 10 acquires data for block processing of four division buffers by the second DMA transfer (DMA transfer B) of the second block at timing t6. The write control unit 20 stores the data for block processing acquired by the DMA transfer B of the second block in the division buffers 7 and 8 and the division buffers 1 and 2 (see FIG. 8X).

Thereafter, if the read control unit 60 completes block processing of the data for block processing acquired by the DMA transfer D, the read control unit 60 continuously reads the data for block processing acquired by the DMA transfer A of the second block stored in the division buffer 6 from timing t7, performs block processing of the read data, and outputs the block-processed data. Thereafter, the read control unit 60 sequentially performs reading from the division buffer storing data for block processing acquired by the DMA transfer of the second block, performs block processing of the read data, and outputs the block-processed data.

As described above, in the data processing apparatus 100 in accordance with the first preferred embodiment, a division buffer storing unnecessary data for block processing is opened after last data for block processing of a block currently being processed is stored. The opened division buffer is in an available state as a division buffer that stores data for block processing to process the next block. Thereby, in the data processing apparatus 100 in accordance with the first preferred embodiment, data to be used in the next block processing can be pre-stored in the buffer 30. Thereby, processing of the next block can be initiated upon completion of the processing of a block currently being processed, and a loss time for which the read control unit 60 waits for the block processing to be initiated can be eliminated.

In addition, in the data processing apparatus 100 in accordance with the first preferred embodiment, data for block processing is not stored in a division buffer when all data for block processing to be stored in the division buffer within initial data for block processing to be used in the next block processing becomes invalid data for block processing. Thereby, it is possible to acquire data for second block processing as processing of the next block comparatively early. Thereby, even when the block processing has ended comparatively early, it is possible to pre-store data to be used in the next block processing in the buffer 30. Thereby, block processing of the next data for block processing can be initiated upon completion of the processing of a block currently being processed, and a loss time in which the read control unit 60 waits for the block processing to be initiated can be eliminated.

In addition, in the data processing apparatus 100 in accordance with the first preferred embodiment, each division buffer is exclusively controlled. That is, an operation in which the write control unit 20 writes (stores) data for block processing and an operation in which the read control unit 60 reads data for block processing are not simultaneously performed for the same division buffer. Thus, it is possible to configure each division buffer by SRAM of a single port and suppress an increase in a circuit scale of the buffer 30 as much as possible.

According to the preferred embodiment of the present invention as described above, a storage capacity of a buffer included in the data processing apparatus is divided into a plurality of areas for each predetermined storage capacity, and a transfer of data necessary for processing is controlled in units of division buffer areas. If a fraction of data, the size of which is less than a break of a transfer (a transfer unit), has been acquired when data necessary for processing is transferred, all data stored in a division buffer area is prevented from becoming unnecessary data for processing. Thereby, it is possible to process data efficiently using a buffer included in the data processing apparatus without easily increasing a buffer size so as to store a fraction of data. Thereby, it is possible to suppress an increase in a circuit scale of the data processing apparatus.

In addition, according to the preferred embodiment of the present invention as described above, a buffer area in which all data is unnecessary for processing is used as a buffer area in which data necessary for the next processing is stored. Thereby, the data necessary for the processing is arranged across a transfer unit in which the data is transferred and the processing of a fraction of data, which is less than the transfer unit, is rapidly completed, so that a loss time occurring due to waiting for the next processing to be started can be reduced. Thereby, when processing is performed for each divided block, it is possible to reduce the loss time during each block processing and shorten the processing time. The configuration of the preferred embodiment of the present invention is effective in a data processing apparatus in which a data transfer, that is, writing of data to the buffer 30 or the division buffer by the DMA I/F 10 and the write control unit 20, is fast in an internal processing time, that is, a processing time of the read control unit 60.

Although the case where the DMA I/F 10 is a data processing apparatus of an input DMA, which acquires data for block processing from the external memory 200, has been described in the first preferred embodiment, the data processing apparatus capable of applying a configuration and a control method of the buffer 30 in accordance with the first preferred embodiment is not limited to the preferred embodiment of the present invention. For example, the present invention can also be applied to various data processing apparatuses, which perform large filtering operations such as a low-pass filtering operation, a noise reduction filtering operation, an image resizing operation, and the like based on image data acquired by a method other than DMA from a data processing apparatus of a previous stage of a pipeline. For example, data corresponding to the number of taps (a filter size) is necessary for the low-pass filtering operation. If the number of taps necessary for processing only data stored in one buffer is not satisfied in a configuration having two buffers as in the related art, the low-pass filtering operation is not performed, and a loss time occurs in which processing waits until data is stored in the other buffer. According to the configuration as in the first preferred embodiment, it is possible to reduce the loss time in which processing waits because data necessary for the low-pass filtering operation can be pre-stored.

Although the case where writing (storing) and reading of data for block processing are managed in units of division buffers has been described in the first preferred embodiment, a unit in which data acquired by the data processing apparatus is managed is not limited to the preferred embodiment of the present invention. For example, writing (storing) and reading of data can be configured to be managed in units of data acquired by the data processing apparatus. In this case, for example, the data processing apparatus 100 divides the buffer 30 into division buffers for each vertical line, and the write control unit 20 determines division buffers for each vertical line in which data for block processing is stored based on the valid data information included in empty buffer information input from the state management unit 40. In addition, the read control unit 60 determines division buffers for each vertical line from which data for block processing is read based on the valid data area information input from the valid data determination unit 50. According to the configuration as described above, it is possible to manage writing (storing) and reading operations in units of data for block processing.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A data processing apparatus comprising:
   a data acquisition unit that acquires data in each unit for acquiring data, the unit being predetermined;
   a buffer unit that includes a plurality of division buffers, each of the plurality of division buffers having a predetermined storage capacity less than an amount to be acquired in one unit for acquiring data by the data acquisition unit, a total storage capacity of the plurality of division buffers being equal to or greater than an amount acquired in two units for acquiring data by the data acquisition unit, the plurality of division buffers within the buffer unit are connected in a ring shape;
   a valid data area determination unit that calculates an area of valid data within data acquired by the data acquisition unit, the valid data area determination unit outputting valid data information indicating whether or not the data acquired by the data acquisition unit is valid data;
   a buffer state management unit that manages whether or not the data is stored in the division buffer for each division buffer included in the buffer unit, the buffer state management unit outputting management information of each managed division buffer;
   a data write control unit that writes data of a unit of the storage capacity of the division buffer, which at least includes data indicated to be valid data by the valid data information within the data acquired by the data acquisition unit in one data acquisition, to the division buffer in which no data is stored, the division buffer being selected based on the management information; and
   a data read control unit that reads data indicated to be valid data by the valid data information from the division buffer in which data is stored, the division buffer being selected based on the management information, the data read control unit performing a vertical-horizontal conversion of the data for block processing stored in the buffer unit,
   wherein the data write control unit outputs a write completion signal to the buffer state management unit after the writing of the data acquired in one data acquisition to the division buffer has been completed,
   wherein based on the write completion signal output from the data write control unit, the buffer state management unit sets the division buffer at a write position being predetermined as a write completion state, determines a read position from the division buffer, and outputs a read permission signal from the division buffer to the data read control unit,
   wherein the data read control unit reads data from the division buffer based on the read permission signal from the division buffer, and outputs a read completion signal to the buffer state management unit after the reading from the division buffer has been completed,
   wherein the buffer state management unit further sets a read position from the buffer as a read completion state based on the read completion signal,
   wherein writing and reading operations are not simultaneously performed for the same division buffer in the buffer unit,
   wherein the data read control unit outputs read completion information including information indicating the division buffer from which the data has been read and a notification indicating that reading of the data has been completed every time the reading of stored data from the division buffers sequentially selected based on the management information is completed,
   wherein the buffer state management unit changes management information of the division buffer from which the data has been read for indicating that the division buffer is in a state in which no data is stored based on the read completion information, and
   wherein the buffer state management unit changes management information of the division buffer in which only unnecessary data is stored for indicating that the division buffer is in a state in which no data is stored, if the necessary data is included in the data acquired by one data acquisition after writing of data acquired by the data acquisition unit in the one data acquisition to the division buffer has been completed by the data write control unit.

2. The data processing apparatus of claim 1, wherein
   the data write control unit sequentially writes data acquired by the data acquisition unit in one data acquisition to the continuous division buffers sequentially selected based on the management information in units of storage capacity of the division buffers,
   the data write control unit outputs write completion information including information indicating the division buffer to which the data has been written and a notification indicating that writing of the data has been completed every time the writing of the data to the division buffer is completed; and
   the buffer state management unit changes management information of the division buffer to which data of the unit of the storage capacity of the division buffer has been written to a state in which the data is stored based on the write completion information.

3. The data processing apparatus of claim 1, wherein the data write control unit controls only data of the unit of the storage capacity of the division buffer, which at least includes data indicated to be valid data by the valid data information within data acquired by the data acquisition unit in one data acquisition, to be written to any one of the division buffers in which no data is stored, which is indicated by the management information.

4. The data processing apparatus of claim 1, wherein the data write control unit outputs a data write control signal to any one division buffer in which no data is stored, which is indicated by the management information, among the plurality of division buffers when writing data of the unit of the storage capacity of the division buffer, which at least includes data indicated to be valid data by the valid data information within data acquired by the data acquisition unit in one data acquisition, to any one of the division buffers.

5. A data processing method comprising the steps of:
  determining a state of each of a plurality of division buffers,
    wherein when a number of the division buffers which are available to be written to is determined to be equal to a predetermined count value of DMA transfers in burst width,
    a batch DMA transfer is performed such that data is simultaneously written to each of the available division buffers, while the plurality of division buffers to which the data are written, are set to an in-use state in which no further data is capable of being written thereto, and
    the data written in the plurality of division buffers is read sequentially, while the plurality of division buffers from which the data is read are set to an empty state in which other data is capable of being written thereto;
  detecting whether invalid data for processing is included in the data acquired by the DMA transfer, by comparing a count value of the DMA transfers corresponding to valid data with the predetermined count value of the DMA transfers in burst width; and
  setting the division buffer, which is set to the in-use state, to which the invalid data is written to the empty state immediately such that other data is capable of being written thereto without reading the invalid data from the corresponding division buffer, when the invalid data for processing is detected to be included in the data acquired by the DMA transfer, is not read.

* * * * *